(12) United States Patent
Noro et al.

(10) Patent No.: US 6,445,320 B1
(45) Date of Patent: Sep. 3, 2002

(54) A/D CONVERSION APPARATUS

(75) Inventors: Masao Noro; Akira Sogo; Ryo Kamiya, all of Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/492,442

(22) Filed: Jan. 27, 2000

Related U.S. Application Data

(63) Continuation-in-part of application No. 09/197,701, filed on Nov. 23, 1998, now abandoned.

(30) Foreign Application Priority Data

Nov. 27, 1919 (JP) .............................................. 9-326391

(51) Int. Cl.[7] .................................................. H03M 1/62
(52) U.S. Cl. ........................ 341/139; 341/143; 341/155
(58) Field of Search ................................. 341/132, 143, 341/139, 155, 156, 161, 110, 111–116, 172

(56) References Cited

U.S. PATENT DOCUMENTS

| | | | |
|---|---|---|---|
| 4,851,841 A | | 7/1989 | Sooch |
| 5,124,707 A | | 6/1992 | Stove |
| 5,194,865 A | | 3/1993 | Mason |
| 5,241,310 A | * | 8/1993 | Tiemann ..................... 341/143 |
| 5,343,200 A | | 8/1994 | Matsui |
| 5,369,404 A | * | 11/1994 | Galton ........................ 341/143 |
| 5,748,129 A | | 5/1998 | Tsumura |
| 5,757,299 A | | 5/1998 | Noro et al. |
| 5,781,138 A | * | 7/1998 | Knudsen ..................... 341/143 |
| 5,808,575 A | | 9/1998 | Himeno et al. |
| 5,892,472 A | | 4/1999 | Shu et al. |
| 5,999,355 A | * | 12/1999 | Behrens et al. ............... 360/65 |
| 6,160,859 A | * | 12/2000 | Martin et al. ................ 375/345 |
| 6,175,849 B1 | * | 1/2001 | Smith ......................... 708/320 |
| 6,204,787 B1 | * | 3/2001 | Baird ......................... 341/139 |

FOREIGN PATENT DOCUMENTS

JP 8-307275 11/1996

* cited by examiner

Primary Examiner—Brian Young
Assistant Examiner—John Nguyen
(74) Attorney, Agent, or Firm—Morrison & Foerster LLP

(57) ABSTRACT

An A/D conversion apparatus is provided, which is capable of securing a wide dynamic range of A/D conversion with a simple construction through suitably switching the input gain of the input analog signal between predetermined levels. An input gain control device controls gain of an input signal based on a control signal. A ΔΣ modulator carries out oversampling of the input signal having the gain thereof controlled by the input gain control device to convert the input signal to data of one bit. A detecting device detects a peak value of the input signal based on the data of one bit. A gain control device generates the control signal based on the peak value detected by the detecting device in a manner such that the input signal having the gain thereof controlled falls within a predetermined range. To effectively reduce noise of the output digital signal while securing a wide dynamic range of A/D conversion, the ΔΣ modulator may also control the gain of the input signal based on the control signal to a predetermined value (1/A) smaller than 1, and the decimation circuit may have a gain of a second predetermined value (A) for compensating for the gain of the input signal controlled to the predetermined value (1/A).

20 Claims, 20 Drawing Sheets

A/D CONVERSION APPARATUS

CROSS-REFERENCE TO RELATED APPLICATIONS

The present application is a continuation-in-part of U.S. application Ser. No. 09/197,701 filed on Nov. 23, 1998 now abandoned for A/D CONVERSION APPARATUS. The disclosure of that application is specifically incorporated herein by reference.

BACKGROUND OF THE INVENTION

1. Field of the Invention

This invention relates to an A/D conversion apparatus that carries out delta-sigma ($\Delta\Sigma$) A/D conversion through oversampling, and more particularly to an AD conversion apparatus of this kind that suitably carries out the A/D conversion over a wide dynamic range through control of the input gain.

2. Prior Art

A/D converters are used for conversion of an analog signal to a digital signal, and some of them employ a so-called floating method to enhance the accuracy of A/D conversion. An A/D converter employing the floating method controls the gain of an input analog signal according to a digital signal after the A/D conversion. FIG. 1 shows a conventional A/D conversion system based on the floating method.

In the figure, reference numeral 100 designates an input gain control circuit to which an input analog signal Sin is supplied. The input gain control circuit 100 controls the input gain based on a control signal C. Reference numeral 200 designates an A/D converter connected to the input gain control circuit 100. The A/D converter 200 converts an analog signal output from the circuit 100 to a digital signal. Reference numeral 300 designates a CPU provided at the next stage of the A/D converter 200. The CPU 300 loads a control program into a main memory for working, and generates the control signal C by executing the program such that the digital signal assumes values within a predetermined range.

The A/D conversion system constructed as above operates in the following manner: When the level of the input analog signal Sin becomes higher than a predetermined value, the CPU 300 detects this and generates the control signal C such that the input gain is decreased. On the other hand, when the level of the input analog signal Sin becomes lower than the predetermined value, the CPU 300 detects this and generates the control signal C such that the input gain is increased. In this way, the input gain is adjusted such that the level of the input signal to the A/D converter 200 is maintained within a predetermined appropriate range. For instance, where the input gain is switched between four stages, it is possible to realize an A/D converter with 10 bit accuracy by using the A/D converter 200 with 8 bit accuracy.

The A/D conversion system described above generates the control signal C by executing the program by the CPU 300 to maintain the level of input signal to the A/D converter 200 within the predetermined appropriate range. This brings about the following problems:

First, it is required to provide the CPU 300 and a storage device to store the program, and this complicates the construction of the system.

Secondly, since the CPU 300 carries out an arithmetic operation, it takes time to generate the control signal C, resulting in a poor response of the system. For instance, when the input analog signal rises sharply, if the arithmetic operation is not carried out fast enough, the control signal cannot be generated in a manner fully following up a change in the input analog signal, so that the waveform of the signal can be clipped.

Thirdly, if the number of bits of the output of the A/D converter 200 is increased, load on the CPU 300 is increased due to an increase in the required arithmetic operation.

On the other hand, another type of A/D conversion apparatus, which is based on the $\Delta\Sigma$ method, is conventionally known. FIG. 2 shows the construction of the conventional A/D conversion apparatus based on the $\Delta\Sigma$ method. A $\Delta\Sigma$ modulator 31 for converting an input analog signal into serial-bit strings is comprised of a switched-capacitor integrator 33, a one-bit quantizer 33 formed by a clocked comparator for quantizing an output of the integrator 33, and a feedback circuit 34 for feeding back an output of the one-bit quantizer 33 to the integrator 32, by delaying the output by one sample based on a positive reference voltage VREF+ or a negative reference voltage VREF- selected depending upon the polarity of the output. The serial bit strings obtained by the $\Delta\Sigma$ modulator 31 are delivered to a digital filter 35 where low-frequency components corresponding to the input analog signal are extracted and converted into digital data having a predetermined number of bits.

To reduce noise of an output digital signal from the A/D conversion apparatus constructed as above, there has been proposed by U.S. Pat. No. 4,851,841 a scaling method which reduces the gain of the $\Delta\Sigma$ modulator 31 to $1/A$ (=1/1.25, for example), and designs the digital filter 35 to have impulse-response coefficients which are selected to provide a gain of A (=1.25, for example).

If the analog input signal contains a DC offset component, to remove the DC offset component at last, it is required that the digital filter 35 is followed by a high-pass filter 36, for example, as shown in FIG. 3. However, when providing the high-pass filter which follows the digital filter 35 under a condition where a certain gain is applied to the digital filter by employing the aforementioned scaling system, the DC offset component can be removed, but a positive or negative part of the input analog signal (actually the digital signal) can be clipped for high-level signals. Such a clipped state may cause deformation corresponding to overflow of data.

To solve this problem, the present assignee has proposed, by U.S. Pat. No. 5,757,299, a scaling method which multiplies the output of the high-pass filter which removes the DC offset component by a factor of A to compensate for the reduction of the gain of the $\Delta\Sigma$ modulator to 1/A, thereby effectively reducing noise while eliminating effect due to occurrence of a clipped state in the analog input signal.

SUMMARY OF THE INVENTION

It is a first object of the invention to provide an A/D conversion apparatus which is capable of securing a wide dynamic range of A/D conversion with a simple construction through suitably switching the input gain of the input analog signal between predetermined levels.

A second object of the invention is to provide an A/D conversion apparatus which is capable of effectively reducing noise of the output digital signal while securing a wide dynamic range of A/D conversion.

To attain the first object, according to a first aspect of the invention, there is provided an A/D conversion apparatus comprising an input gain control device that controls gain of an input signal based on a control signal, a $\Delta\Sigma$ modulator converter that carries out oversampling of the input signal having the gain thereof controlled by the input gain control device to convert the input signal to data of one bit, a detecting device that detects a peak value of the input signal based on the data of one bit, and a gain control device that generates the control signal based on the peak value detected by the detecting device in a manner such that the input signal having the gain thereof controlled falls within a predetermined range.

To attain the first object, according to a second aspect of the invention, there is provided an A/D conversion apparatus comprising an input gain control device that controls gain of an input signal based on a control signal, a $\Delta\Sigma$ modulator that carries out oversampling of the input signal having the gain thereof controlled by the input gain control device to convert the input signal to data of one bit, a moving average-calculating device that calculates moving average data indicative of a moving average of the data of one bit, and a gain control device that generates the control signal based on the moving average data in a manner such that the input signal having the gain thereof controlled falls within a predetermined range.

Preferably, the moving average-calculating device calculates the moving average data based on a plurality of values of the data of one bit in a manner such that shaping noise generated by the oversampling of the input signal by the $\Delta\Sigma$ modulator can be sufficiently suppressed, and at the same time the moving average data has a flat frequency characteristic over a bandwidth of the input signal.

More preferably, a number of the values of the data of one bit used for calculating the moving average data is set based on at least one of a frequency of the oversampling and the bandwidth of the input signal.

Preferably, the gain control device generates the control signal with a faster response in a gain-decreasing direction and with a slower response in a gain-increasing direction.

Preferably, the gain control device generates the control signal with a faster response in a gain-decreasing direction and with a slower response in a gain-increasing direction.

More preferably, the A/D conversion apparatus includes a maximum value-detecting device that detects a maximum value of the moving average data over a predetermined time period, and the gain control device generates the control signal in the gain-decreasing direction when the maximum value becomes larger than a first predetermined value.

Further preferably, the first predetermine value is set to a value smaller than a saturation level of the input signal in dependence on a slew rate of the input signal and a response of the gain control device.

Further preferably, the gain control device generates the control signal in the gain-increasing direction when the maximum value of the moving average data continues to be smaller than a second predetermined value smaller than the first predetermine value over a predetermined time period.

Alternatively, the gain control device generates the control signal in the gain-increasing direction when the maximum value of the moving average data becomes smaller than a third predetermined value smaller than the second predetermined value.

Also alternatively, the gain control device generates the control signal in the gain-increasing direction when a value of the moving average data becomes smaller than a third predetermined value smaller than the second predetermined value.

Further preferably, the control device generates the control signal in the gain-increasing direction when a value of the moving average data continues to be smaller than a second value smaller than the first predetermine value.

Preferably, the A/D conversion apparatus includes a storage device that stores a weighting coefficient for weighting the data of one bit, the weighting coefficient being generated based on the control signal.

More preferably, the weighting coefficient is set in a manner such that as the gain is increased, the weighting coefficient is decreased, and as the gain is decreased, the weighting coefficient is increased.

Further preferably, the weighting coefficient is set to a reciprocal of the gain.

To attain the first object, according to a third aspect of the invention, there is provided an A/D conversion apparatus comprising an input gain control device that controls gain of an input signal based on a control signal, a $\Delta\Sigma$ modulator that carries out oversampling of the input signal having the gain thereof controlled by the input gain control device to convert the input signal to data of one bit, a moving average-calculating device that calculates moving average data indicative of a moving average of the data of one bit, a detecting device that detects a peak value of the input signal based on the moving average, and a gain control device that generates the control signal based on the peak value detected by the detecting device in a manner such that the input signal having the gain thereof controlled falls within a predetermined range.

To attain the first object, according to a fourth aspect of the invention, there is provided an A/D conversion apparatus comprising a $\Delta\Sigma$ modulator having a gain control function that controls gain of an input signal based on a first gain factor corresponding to a control signal, and carries out oversampling of the input signal having the gain thereof controlled to convert the input signal to bit stream data, a gain control device that generates the control signal representative of a peak value of the input signal based on the bit stream data from the $\Delta\Sigma$ modulator, and a decimation circuit that generates a multiple-bit digital signal based upon the bit stream data from the $\Delta\Sigma$ modulator and the control signal from the gain control device in a manner such that a second gain factor is applied to the multiple-bit digital signal to compensate for the gain of the input signal controlled based upon the first gain factor by the $\Delta\Sigma$ modulator.

To attain the second object, in the A/D conversion apparatus according to the fourth aspect, the $\Delta\Sigma$ modulator further has a third gain factor set to a fixed value (A), the $\Delta\Sigma$ modulator controlling the gain of the input signal based upon the third gain factor (A) and the first gain factor, and carrying out oversampling of the input signal having the gain thereof controlled to convert the input signal to the bit stream data. The decimation circuit further has a fourth gain factor set to a fixed value (1/A), the decimation circuit compensating for the gain of the input signal based upon the fourth gain factor (1/A) and the second gain factor.

To attain the second object, according to a fifth aspect of the invention, there is provided an A/D conversion apparatus comprising a $\Delta\Sigma$ modulator having a gain control function that controls gain of an input signal based on a first gain factor corresponding to a control signal and a second gain factor set to a fixed value (A), and carries out oversampling of the input signal having the gain thereof controlled to convert the input signal to bit stream data, a gain control device that generates the control signal representative of a peak value of the input signal based on the bit stream data from the $\Delta\Sigma$ modulator, a decimation circuit that generates a multiple-bit digital signal based upon the bit stream data from the ΔΣ modulator and the control signal from the gain control device in such a manner that a third gain factor is applied to the multiple-bit digital signal to compensate for the gain of the input signal controlled based upon the first gain factor by the ΔΣ modulator, a high-pass filter that removes a direct current component in the multiple-bit digital signal generated from the decimation circuit, and a gain applying circuit that applies a fourth gain factor set to a fixed value (1/A) to the multiple-bit digital signal having the direct current component removed from high-pass filter, to compensate for the gain of the input signal controlled based upon the second gain factor (A) by the ΔΣ modulator.

The above and other objects, features and advantages of the invention will become more apparent from the following detailed description taken in conjunction of the accompanying drawings.

BRIEF DESCRIPTION OF THE DRAWINGS

FIGS. 8A to 8D collectively form a timing chart which is useful in explaining the operation of the third example of the gain-controlled ΔΣ modulator 1, in which:

FIG. 8A shows a waveform of a clock signal CK;

FIG. 8B shows a waveform of a main clock signal CKm;

FIG. 8C shows a waveform of an output signal from a pulse control section in the case of a control signal CONT assuming a value of "1"; and FIG. 8D shows a waveform of an output signal from the pulse control section in the case of the control signal CONT assuming a value of "2";

FIGS. 22A to 22C are views showing waveforms of signals, in which:

FIG. 22A shows a waveform of an input analog signal;

FIG. 22B shows a waveform of an output of a high-pass filter 50; and

FIG. 22C shows a waveform of an output of a shifter 60.

DETAILED DESCRIPTION

Next, the invention will be described in detail with reference to drawings showing embodiments thereof.

Figure 1:
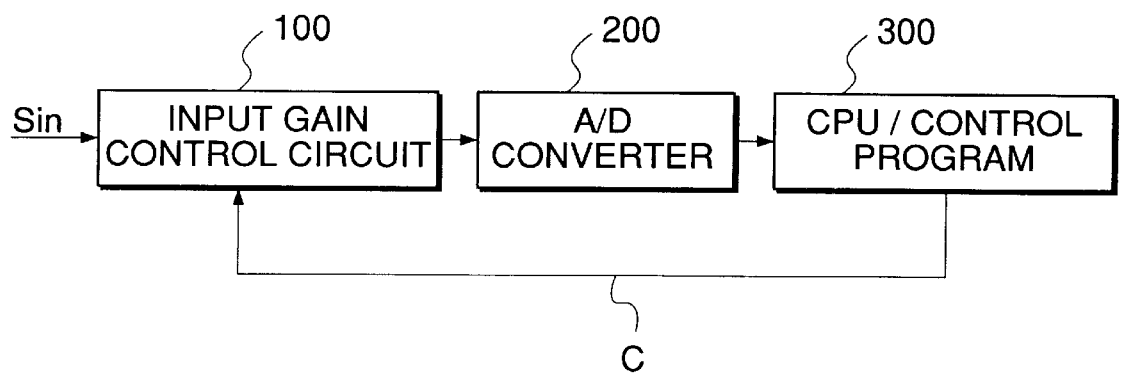
FIG. 1 is a block diagram showing the arrangement of a conventional A/D conversion system based on the floating method.
Figure 4:
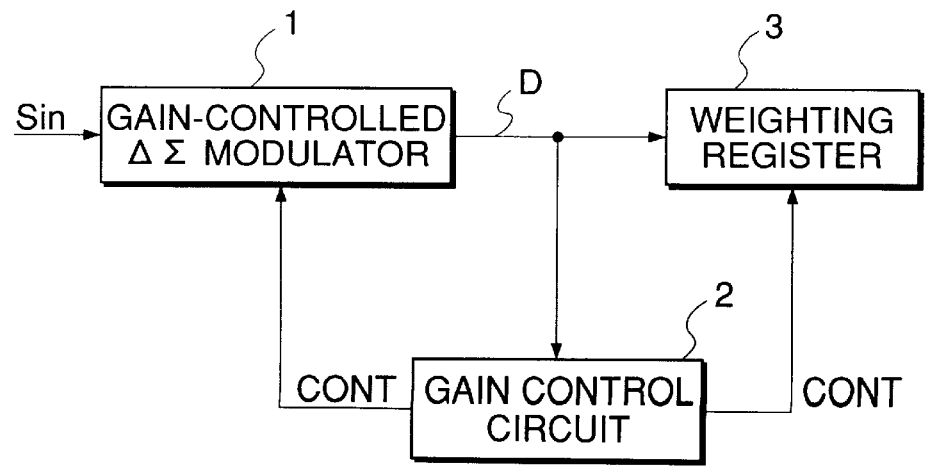
FIG. 4 is a block diagram showing the arrangement of a delta-sigma A/D conversion apparatus according to a first embodiment of the invention.
Figure 2:
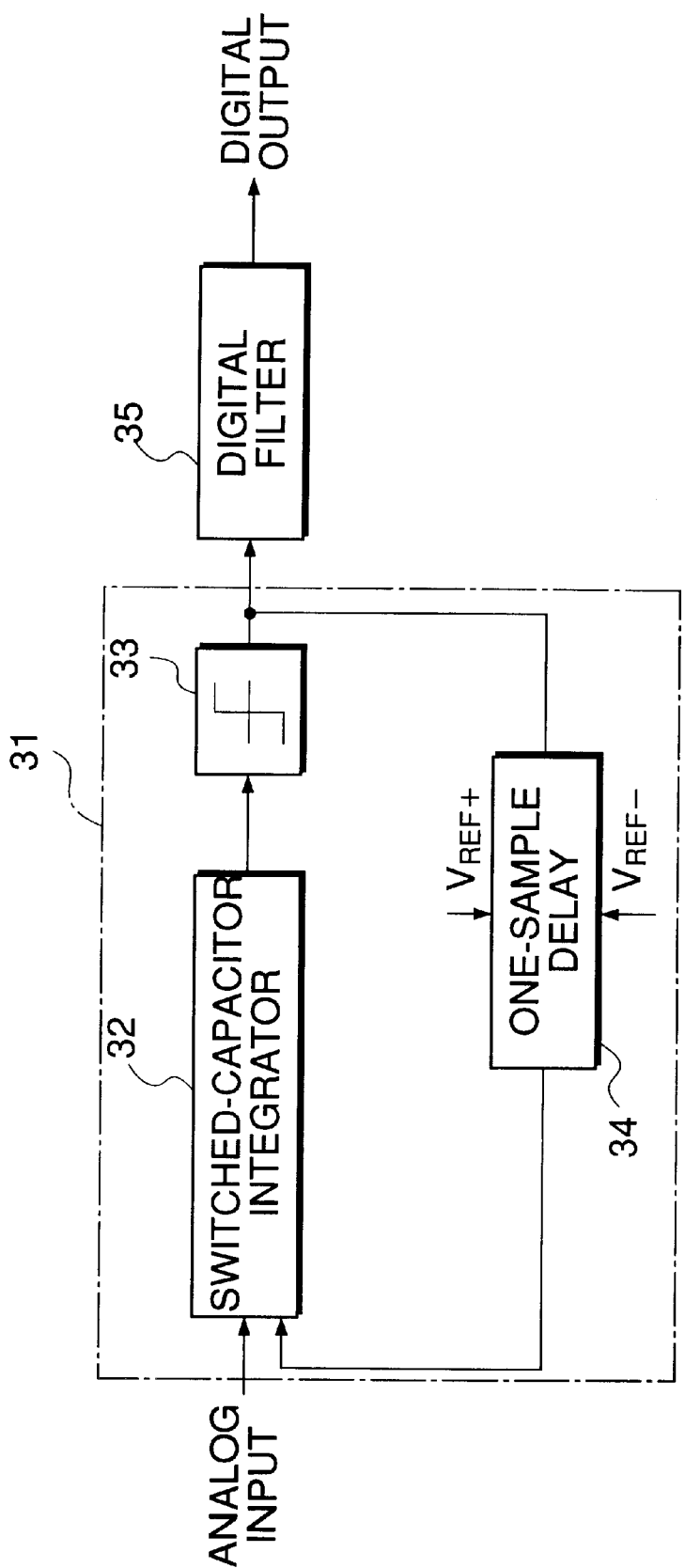
FIG. 2 is a block diagram showing the arrangement of a conventional delta-sigma A/D conversion apparatus based on the ΔΣ method.
Figure 3:
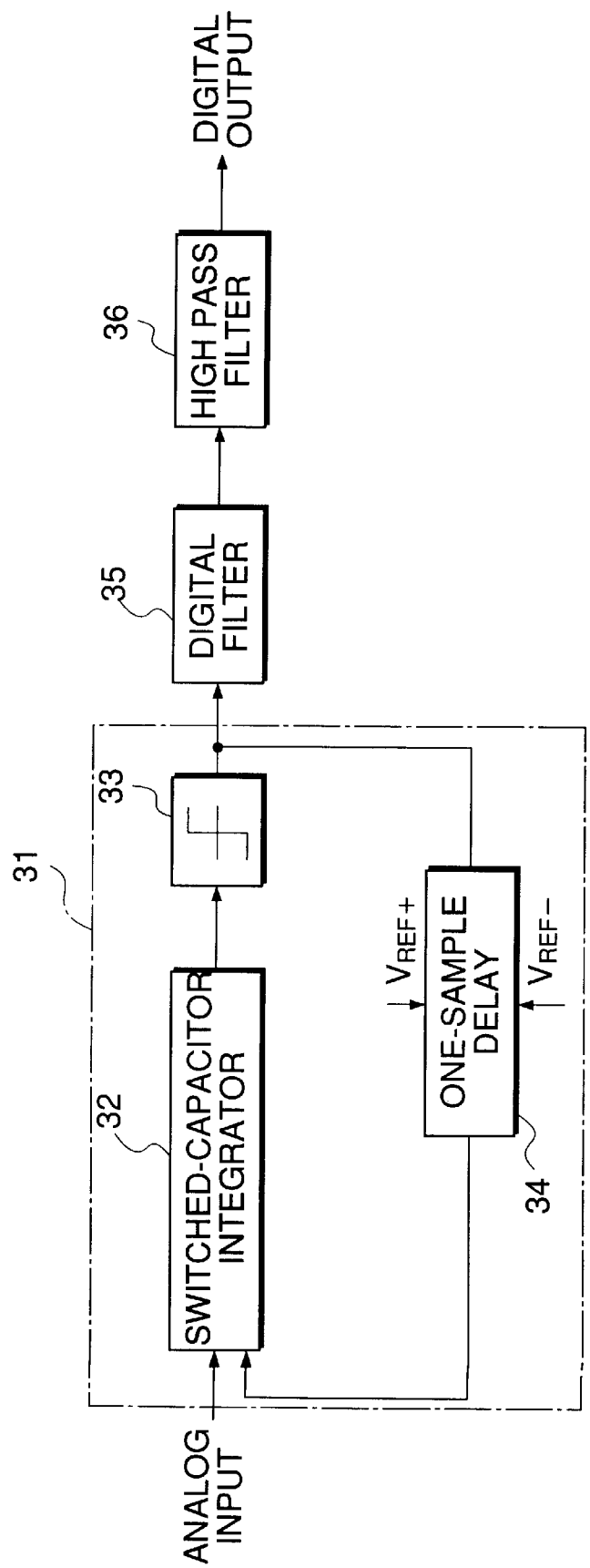
FIG. 3 is a block diagram showing the arrangement of another conventional delta-sigma A/D conversion apparatus based on the ΔΣ method.

FIG. 4 schematically shows the construction of a delta-sigma A/D conversion apparatus according to a first embodiment of the invention. In the figure, reference numeral 1 designates a gain-controlled ΔΣ modulator which is comprised of an input gain control section for controlling the level of an input analog signal, and a one-bit ΔΣ modulator. The one-bit ΔΣ modulator carries out oversampling of the input analog signal and at the same time adds shaping noise obtained by noise shaping to the sampled data to thereby generate bit stream data D of one bit. For instance, assuming that the bandwidth of the input analog signal extends up to 24 KHz, ΔΣ modulation is carried out e.g. at a sampling frequency of 6 MHz or 12 MHz.

Reference numeral 2 designates a gain control circuit. The gain control circuit 2 detects a peak value of the gain-controlled input analog signal Sin, based on the bit stream data D. More specifically, in the illustrated example, the peak value of the gain-controlled input analog signal Sin is detected directly from the bit stream data D without converting the bit stream data of one bit to data of multiple bits. This makes it possible to dispense with means for converting the bit stream data D to multiple bit data. Further, the gain control circuit 2 generates a control signal CONT based on the detected peak value, for use in controlling the input gain, and supplies the control signal CONT to the gain-controlled ΔΣ modulator 1.

Reference numeral 3 designates a weighting register which is supplied with the bit stream data D and the control signal CONT, and stores a weighting coefficient K corresponding to the input gain according to the control signal CONT.

The delta-sigma A/D conversion apparatus constructed as described above operates in the following manner: The gain-controlled ΔΣ modulator 1 carries out oversampling of the input analog signal Sin to generate bit stream data D. The gain control circuit 2 detects the peak value of the gain-controlled input analog signal Sin based on the bit stream data D, and generates the control signal CONT based on the detected peak value. The ΔΣ modulator 1 controls the input gain of the input analog signal at a front end of the delta-sigma conversion apparatus in response to the control signal CONT. More specifically, when the level of the input analog signal Sin becomes too high, the input gain is decreased, whereas when the level of the same becomes too low, the input gain is increased, whereby the level of the signal subjected to the A/D conversion is held within a predetermined range.

Next, examples of the gain-controlled ΔΣ modulator 1 will be described.

Figure 5:
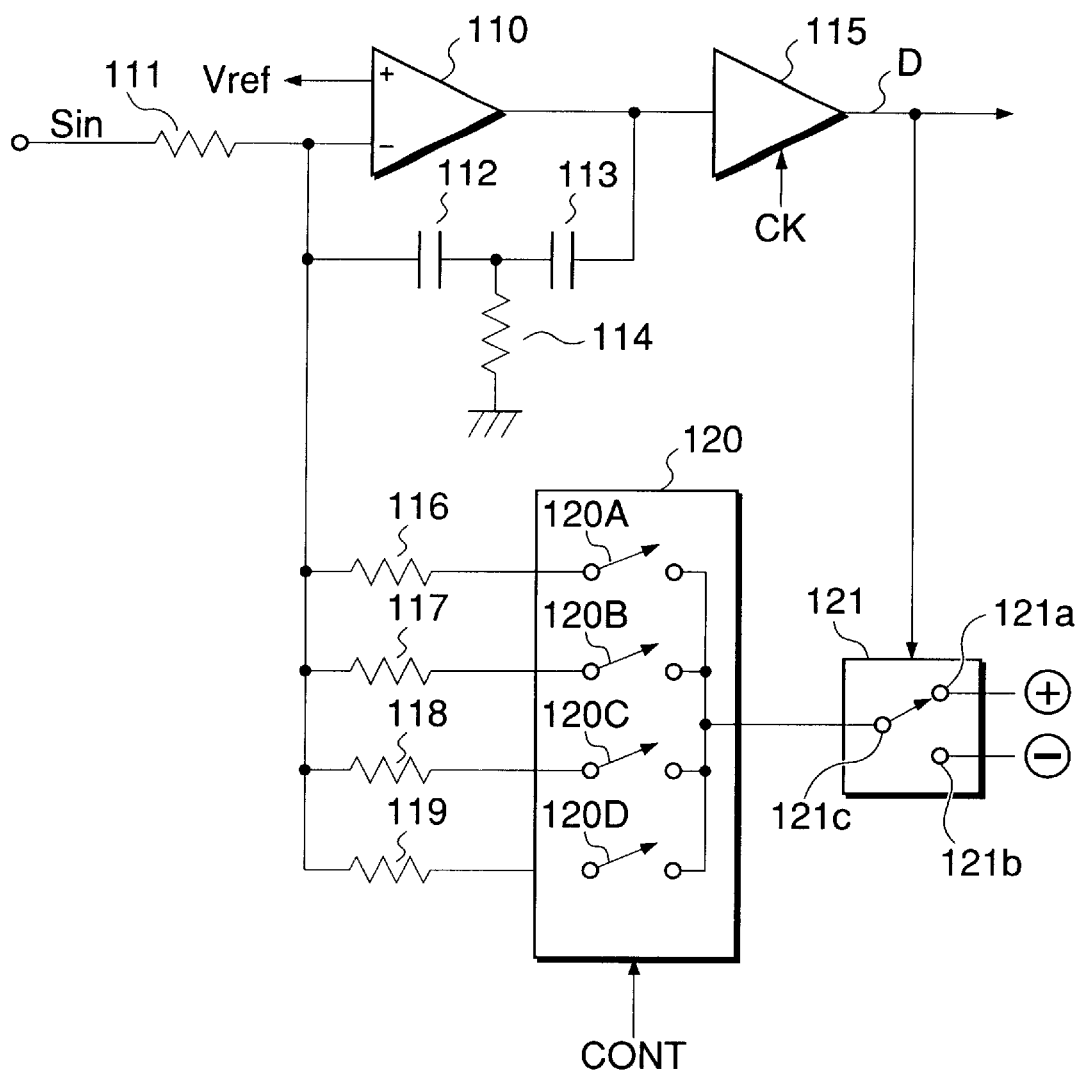
FIG. 5 is a circuit diagram showing the construction of a first example of a gain-controlled ΔΣ modulator 1 appearing in FIG. 4.

A first example of the ΔΣ modulator 1 carries out the gain control by switching the value of feedback resistance. FIG. 5 shows the construction of the first example of the ΔΣ modulator 1 which is comprised of an operational amplifier 110, a comparator 115, resistances 111, 114, 116 to 119, and switches 120 and 121.

The operational amplifier 110 has a negative input terminal thereof supplied with the input analog signal Sin via the resistance 111 and a positive input terminal thereof supplied with a reference voltage Vref. Capacitors 112 and 113 are interposed between the negative input terminal of the operational amplifier 110 and an output terminal of the same, with a junction of the capacitors 112 and 113 being grounded via the resistance 114. Thus, the operational amplifier 110, the capacitors 112, 113, and the resistances 111, 114 constitute a second-order low-pass filter.

Further, the output terminal of the operational amplifier 110 is connected to an input terminal of the comparator 115. The comparator 115 compares the level of a signal input thereto with a predetermined threshold level in synchronism with a clock signal CK to generate the bit stream data D of one bit. The bit stream data D is output at a bit rate of N times (e.g. 64 times, or 128 times) as high as the sampling frequency of a digital signal to be finally output from the delta-signal A/D conversion apparatus. In the illustrated example, various kinds of waveform processing are carried out by using the bit stream data D, and finally the bit stream data D is converted to a multi-bit digital signal and subjected to subsampling into a digital signal corresponding to the sampling frequency, by a decimation filter, not shown.

Further, the switch 121 has a terminal 121a supplied with a positive reference voltage (e.g. 5 V), and a terminal 121b supplied with a negative reference voltage (e.g. 0 V). The switching operation of the switch 121 is controlled based on the bit stream data D supplied to a control terminal of the switch 121. More specifically, when the bit stream data D assumes a value of "1", the terminal 121a is selected, whereas when the same assumes a value of "0", the terminal 121b is selected. Thus, the positive or negative reference voltage is selected depending on the value of the bit stream data D.

Further, the switch 120 is comprised of switches 120A to 120D which have respective one terminals thereof connected to resistances 116 to 119, and respective other terminals thereof connected to a terminal 121c of the switch 121. The opening/closing operation of each of the switches 120A to 120D is controlled by the control signal CONT. The resistances 116 to 119 are set to respective values in a proportion of 1:2:4:8. Therefore, the value of the feedback resistance can be switched by using the control signal CONT, to thereby control the gain of the signal input to the comparator 115. In the illustrated example, by properly controlling the opening/closing operation of the switches 120A to 120D, it is possible to control the gain through 4 stages.

The ΔΣ modulator 1 constructed as above is capable of carrying out second-order noise shaping through oversampling while switching the gain for amplifying the input analog signal Sin.

A second example of the ΔΣ modulator 1 switches the value of weighting on the input signal by switching the value of feedback current.

Figure 6:
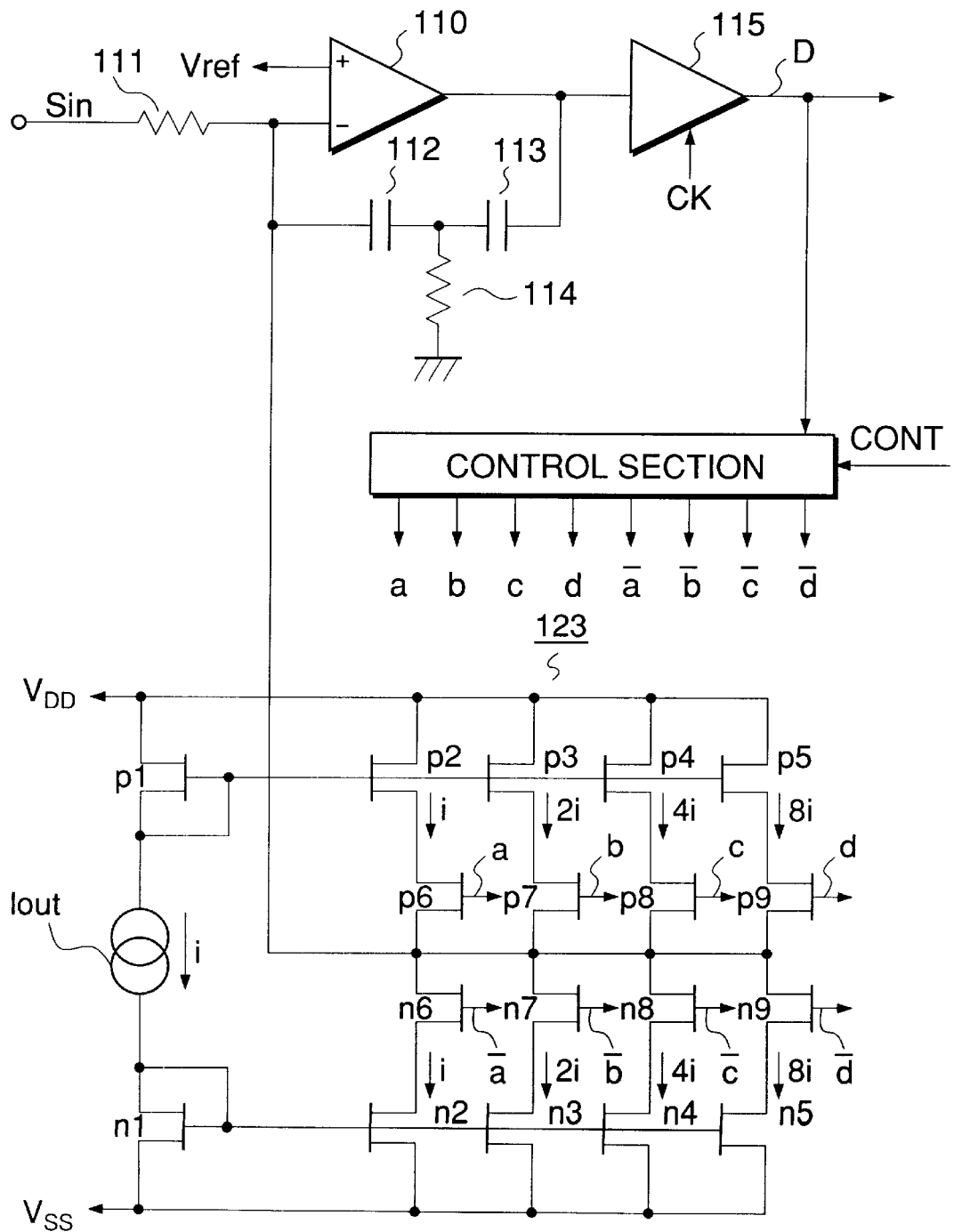
FIG. 6 is a circuit diagram showing the construction of a second example of the gain-controlled ΔΣ modulator 1.

FIG. 6 shows the construction of the second example of the ΔΣ modulator 1 which is comprised of the operational amplifier 110, the comparator 115, the resistances 111 and 114, the capacitors 112 and 113, a control section 122, and a current switching section 123.

The control section 122 generates current switching signals a to d and /a to /d based on the bit stream data D and the control signal D. ("/" is a symbol representing a bar.) More specifically, when the bit stream data assumes a value of "1", at least one of the current switching signals a to d is made active by the control signal CONT, whereas when the same assumes a value of "0", at least one of the current switching signals /a to /d is made active by the control signal CONT.

The current switching section 123 is comprised of a current source Iout, P-channel FET's p1 to p9, and N-channel FET's n1 to n9. The P-channel FET's p1 and p2 to p5 form a current mirror circuit, while the N-channel FET's n1 and n2 to n5 similarly form a current mirror circuit. The P-channel FET p1 and the P-channel FET's p2 to p5 are formed such that their gate widths are in a proportion of 1:1:2:4:8. The N-channel FET n1 and the N-channel FET's n2 to n5 are similarly formed such that their gate widths are in a proportion of 1:1:2:4:8. In the current mirror circuit, current flows in an amount proportional to the gate width, and hence assuming that the value of current flowing from the current source Iout is i, the values of current flowing through the P-channel FET's p2 to p5 are i, 2i, 4i, and 8i, respectively. Similarly, the values of current flowing through the N-channel FET's n2 to n5 are i, 2i, 4i, and 8i, respectively.

The P-channel FET's p6 to p9 and the N-channel FET's n6 to n0 operate as switches which turn on and off in response to the respective current switching signals a to d, and /a to /d. Therefore, when the current switching signal b is made active, and the other current switching signals are made inactive, current of 2i flows from the current switching section 123. Further, when the current switching signals /b and /c are made active, and the other current switching signals are made inactive, current of 6i flows into the current switching section 123. Thus, by properly selecting the current switching signals a to d and /a to /d, the value of feedback current can be switched, whereby the input gain can be controlled through 16 stages.

In this way, the second example of the ΔΣ modulator 1 switches the value of feedback current based on the control signal CONT. This makes it possible to carry out second-order noise shaping through oversampling while switching the gain for amplifying the input analog signal Sin.

When the first example of the gain-controlled ΔΣ modulator 1 is integrated into an IC, it is required to form various high-accuracy resistances within the IC to switch between them. The masking area required to form these resistances is very large compared with that of the FET's used in the second example of the gain-controlled ΔΣ modulator 1. Therefore, by forming the current switching section 123 of FET's as in the second example of the ΔΣ modulator 1, it is possible to reduce the total masking area of the gain-controlled ΔΣ modulator 1.

A third example of the ΔΣ modulator 1 switches the value of weighting on the input signal by switching the number of feedback pulses.

Figure 7:
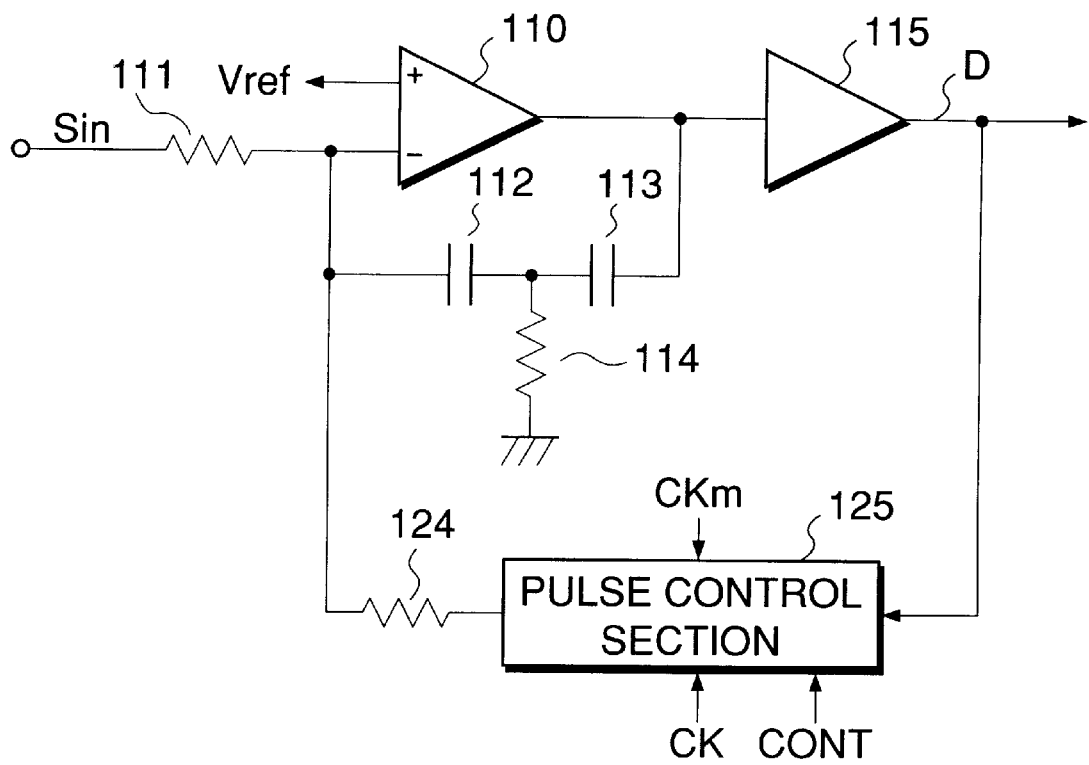
FIG. 7 is a circuit diagram showing the construction of a third example of the gain-controlled ΔΣ modulator 1.

FIG. 7 shows the construction of the third example of the ΔΣ modulator 1 which is comprised of the operational amplifier 110, the comparator 115, the resistances 111 and 114, a resistance 124, the capacitors 112 and 113, and a pulse control section 122.

The pulse control section 125 generates pulses of positive polarity in a number dependent on the control signal CONT when the bit stream data assumes a value of "1", and pulses of negative polarity in a number dependent on the control signal CONT when the same assumes a value of "0".

Figure 8:
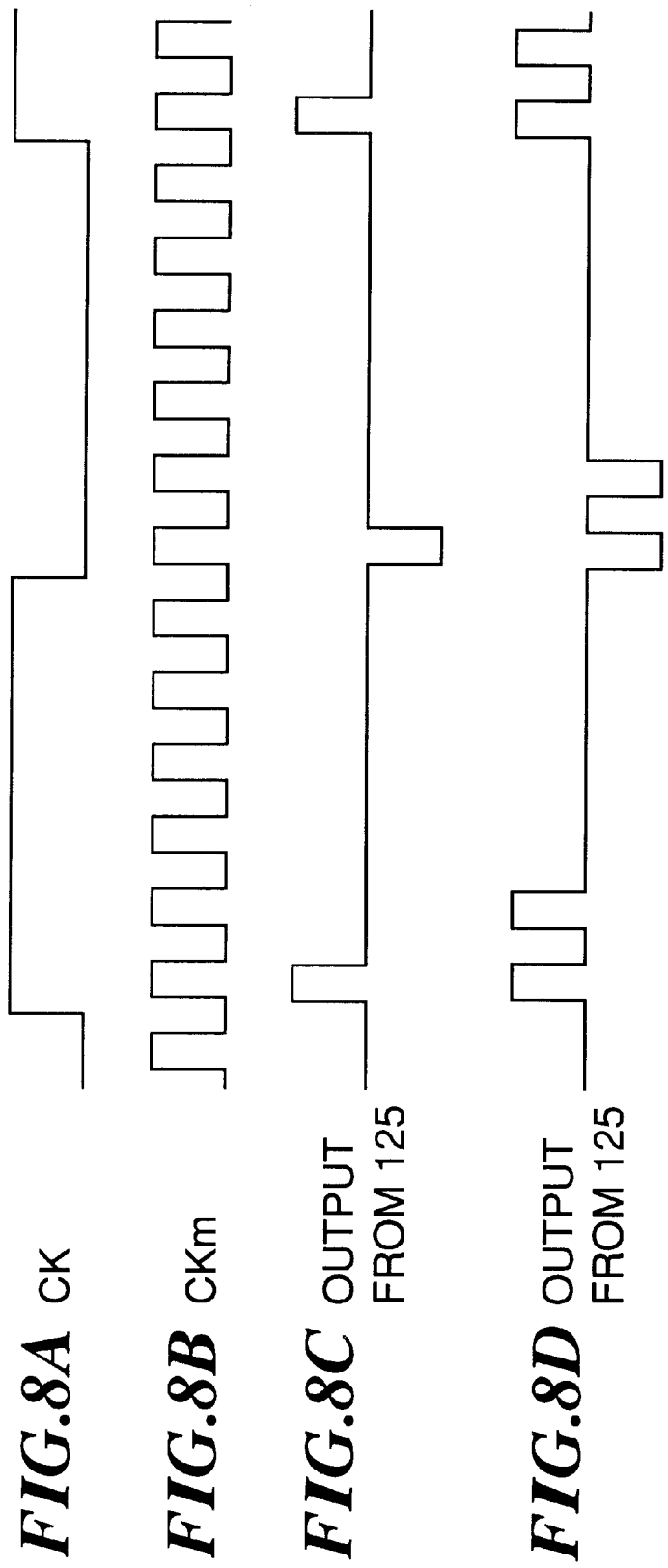

For instance, let it be assumed that the clock signal CK has a waveform as shown in FIG. 8A, and a main clock signal CKm has a waveform shown in FIG. 8B. The main clock signal CKm is generated by a quartz oscillator, not shown, and the clock signal CK is generated by dividing the frequency of the main clock signal CKm. Therefore, the clock signal CK and the main clock signal CKm are synchronous to each other. When the control signal CONT assumes a value of "1", for instance, an output signal from the pulse control section 125 has a waveform as shown in FIG. 8C. Further, when the control signal CONT has a value of "2", the output signal from the pulse control section 125 has a waveform as shown in FIG. 8D. That is, pulses synchronous to the main clock signal CKm are fed back in a number designated by the control signal CONT to the operational amplifier 110.

In this case, it is the number of pulses generated that is controlled, and the pulse width of each generated pulse is determined by the pulse width of the main clock signal CKm. The main clock signal CKm which is generated by the quartz oscillator, as described hereinabove, has a very accurate pulse width. Therefore, according to this example of A/D converter, it is possible to control the feedback amount with high accuracy.

Thus, according to the third example of ΔΣ modulator 1, the number of feedback pulses is switched based on the control signal CONT. Therefore, this makes it possible to carry out second-order noise shaping through oversampling while switching the gain for amplifying the input analog signal Sin.

Figure 9:
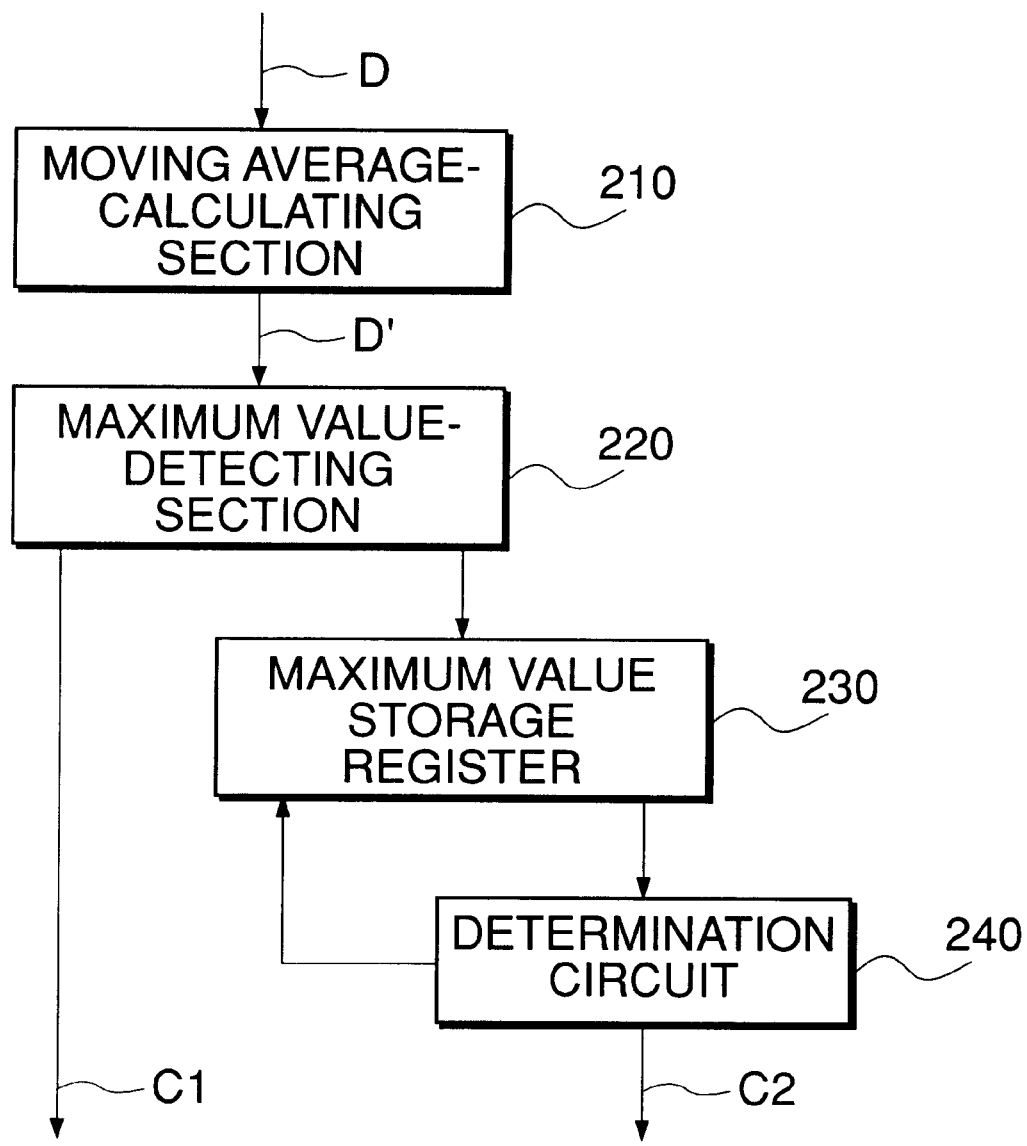
FIG. 9 is a block diagram showing the construction of a gain control circuit 2 appearing in FIG. 4.

Next, the construction of the gain control circuit 2 will be described. FIG. 9 shows the construction of the gain control circuit 2. In the figure, reference numeral 210 designates a moving average-calculating section for calculating moving average data D' based on the bit stream data D. More specifically, a value "1" of the bit stream data D is set to "1", and a value "0" of the same to "−1", and n values thus set are added together to obtain the moving average data D'.

Figure 10:
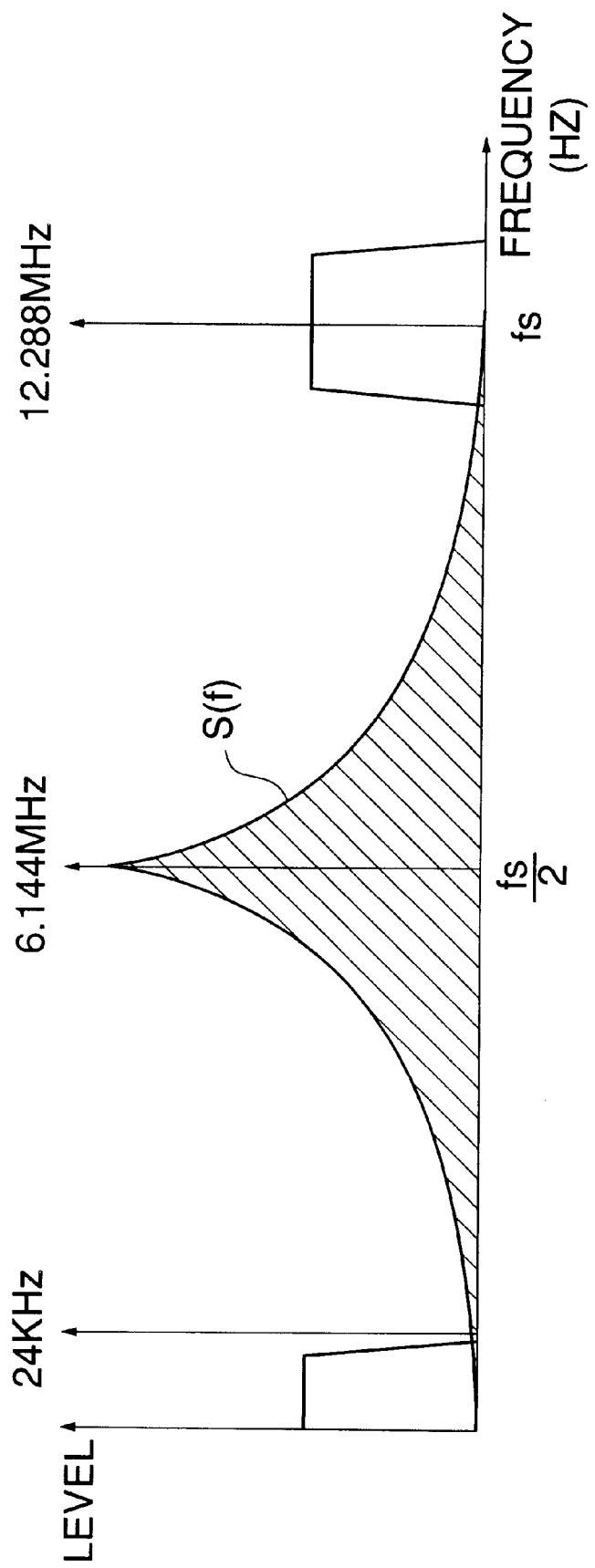
FIG. 10 is a diagram showing a frequency characteristic of bit stream data generated by the gain-controlled A/D converter.

If a one-bit A/D converter which performs the second-order noise shaping as in the above example carries out 256-times oversampling of the input analog signal Sin having a bandwidth of 0 Hz to 24 KHz, the bit stream data D has a frequency characteristic as shown in FIG. 10. The hatched portion in the figure represents noise components S(f), which is given by the following equation:

$$S(f) = 16\, r\, \mathrm{Sin}^4(\pi f) \quad (1)$$

Further, if the moving average-calculating section 210 calculates the moving average data D' based on the n values of bit stream data D, a transfer function H(f) of the moving average processing is given by the following equation:

$$H(f) = f_s\, \mathrm{Sin}(nf \cdot 2\pi / f_s) \quad (2)$$

where r represents quantization noise obtained by the one-bit quantizer, and fs represents the sampling rate. Therefore, from the equations (1) and (2), the noise components N(f) contained in the moving average data D' can be given by the following equation:

$$N(f) = S(f) \cdot H(f) = \frac{f_s \mathrm{Sin}\left(\frac{nf \cdot 2\pi}{f_s}\right)}{} \cdot 16 r \mathrm{Sin}^4\left(\frac{\pi f}{}\right) \quad (3)$$

The gain control circuit 2 determines whether or not a peak value of the moving average data D' is about to exceed a saturation level of an input signal received by the ΔΣ modulator, and generates the control signal CONT such that the level of the input signal falls within a predetermined dynamic range. Therefore, the noise component N(f) has only to have a level not higher than half the peak value of the input signal. Here, in the case of a one-bit quantizer, the maximum value of the input signal is equal to the level of the quantization noise r.

Therefore, the noise component N(f) is required to fulfill the following conditions:

$$N(f) < \frac{r}{\,} \quad (4)$$

$$\frac{f_s \mathrm{Sin}\left(\frac{nf \cdot 2\pi}{f_s}\right)}{} \cdot 16 r \mathrm{Sin}^4\left(\frac{\pi f}{}\right) < \frac{r}{\,} \quad (5)$$

Further, the following conditions hold:

$$|\mathrm{Sin}(nf \cdot 2\pi/f_s)| < 1 \quad (6)$$

$$|\mathrm{Sin}^4(nf/f_s)| < 1 \quad (7),$$

Therefore, from the above conditions (4) and (5), there is derived the following expression:

$$n > 16\, f_s/\pi f \quad (8)$$

The noise component N(f) assumes the maximum value when f=fs/2 holds, and if this value is substituted for f in the expression (8), there is obtained the following expression:

$$n > 32/\pi \approx 10.2 \quad (9)$$

This means that the number n of values of the bit stream data D for use in calculation of the moving average value should be set to 11 or more.

For instance, if n is set to 16, the attenuation amount of the 24 KHz component with respect to the 0 Hz component is 0.16% (−0.014 dB). In this case, the peak value of the moving average data D' can be detected while preserving a sufficiently flat frequency characteristic of the signal bandwidth (0 Hz to 24 KHz). In the illustrated example, n is set to 16, whereby the moving average-calculating section 210 calculates the moving average data D' based on 16 values of the bit stream data D.

As described above, in the moving average-calculating section 210, the number n of values of the bit stream data D based on which the moving average is calculated is set in dependence on the oversampling frequency or the bandwidth of the input analog signal Sin. This makes it possible to sufficiently suppress the shaping noise and at the same time make the moving average data have a flat frequency characteristic over the bandwidth of the input analog signal Sin. As a result, the moving average-calculating section 210 is capable of detecting the peak value of the gain-controlled input analog signal as the moving average data D' with accuracy sufficient to generate the control signal.

Referring again to FIG. 9, reference numeral 220 designates a maximum value-detecting section for detecting the maximum value of the moving average data D' within a predetermined time period, and compares the detected maximum value with a first predetermined threshold value R1. If the former is higher than the latter, a gain-down control signal C1 is generated to instruct a gain-down or decrease in the input gain of the gain-controlled $\Delta\Sigma$ modulator 1. On the other hand, if the former is lower than the latter, the detected maximum value is delivered as it is. The first threshold value R1 is set to a value which is lower than the saturation level and selected with the slew rate of the input analog signal Sin and the response of the gain control system taken into consideration.

Reference numeral 230 designates a maximum value storage register for storing a predetermined number of maximum values delivered from the maximum value-detecting section 220. By referring to the maximum value storage register 230, it is possible to detect a change in the maximum value of the moving average data D' over a predetermined time period in the past.

Reference numeral 240 designates a determination circuit for determining whether or not a gain-up or increase in the input gain should be instructed. More specifically, the maximum value stored in the maximum value register 230 is read out and compared with a second predetermined threshold value R2, whereby only when the maximum value is not larger than the second threshold value R2 over a predetermined time period, a gain-up control signal C2 for instructing the gain-up is generated, and at the same time the data stored in the maximum value register 230 is reset. On the other hand, if the maximum value becomes larger than the second threshold value R2 before the predetermined time period elapses, the present gain is held without generating the gain-up control signal C2.

That is, when the value of the moving average data D' continues to be smaller than the second threshold value R2 over the predetermined time period, the gain-up control signal C2 is generated. Therefore, gain control in a gain-decreasing direction is carried out immediately when the maximum value of the moving average data D' exceeds the first threshold value R1, whereas gain control in a gain-increasing direction is carried out only when the maximum value has continued to be smaller than the second threshold value R2 over the predetermined time period.

Thus, the response of the gain control is made different between the input gain-decreasing direction and the input gain-increasing direction. This is for the following reasons: When the input gain is decreased, though there is a possibility of occurrence of noise due to switching of the gain value, there can be no inconvenience of clipping of the waveform of the input analog signal Sin caused by an excessively high level thereof. On the other hand, when the input gain is increased, the input analog signal Sin at a higher level than before is received, whereby there is a possibility of clipping of the waveform of the signal Sin. When such clipping occurs, information outside the dynamic range is lost and cannot be recovered, resulting in a significant distortion. To avoid this inconvenience, in the illustrated example, the gain-down control signal C1 is generated with a faster response for decreasing the input gain, whereas the gain-up control signal C2 is generated with a slower response for increasing the input gain. These signals C1 and C2 are delivered as the control signal CONT to the gain-controlled $\Delta\Sigma$ modulator 1 and the weighting register 3.

Next, the construction of the weighting register 3 will be described. The weighting register 3 is supplied with the control signal CONT, whereby a weighting coefficient K corresponding to the control signal CONT is stored in the weighting register 3. More specifically, a preset value of the weighting coefficient K is stored in the weighting register 3 in its initial state, and the weighting coefficient K is changed in response the control signal CONT.

The weighting coefficient K is given as the reciprocal of the input gain G. More specifically, as the input gain G is increased, the weighting coefficient K is decreased, and inversely, as the former is decreased, the latter is increased.

Therefore, by referring to the weighting register 3, the weighting coefficient K dependent on the input gain G can be determined. To this end, a data processing circuit provided at a latter stage of the delta-sigma A/D converter processes data with reference to the weighting coefficient K stored in the weighting register 3. For instance, arithmetic operation is carried out on the weighting coefficient K, and multi-bit digital data as a final output is generated based on the processed weighting coefficient K and bit stream data D corresponding thereto.

Figure 11:
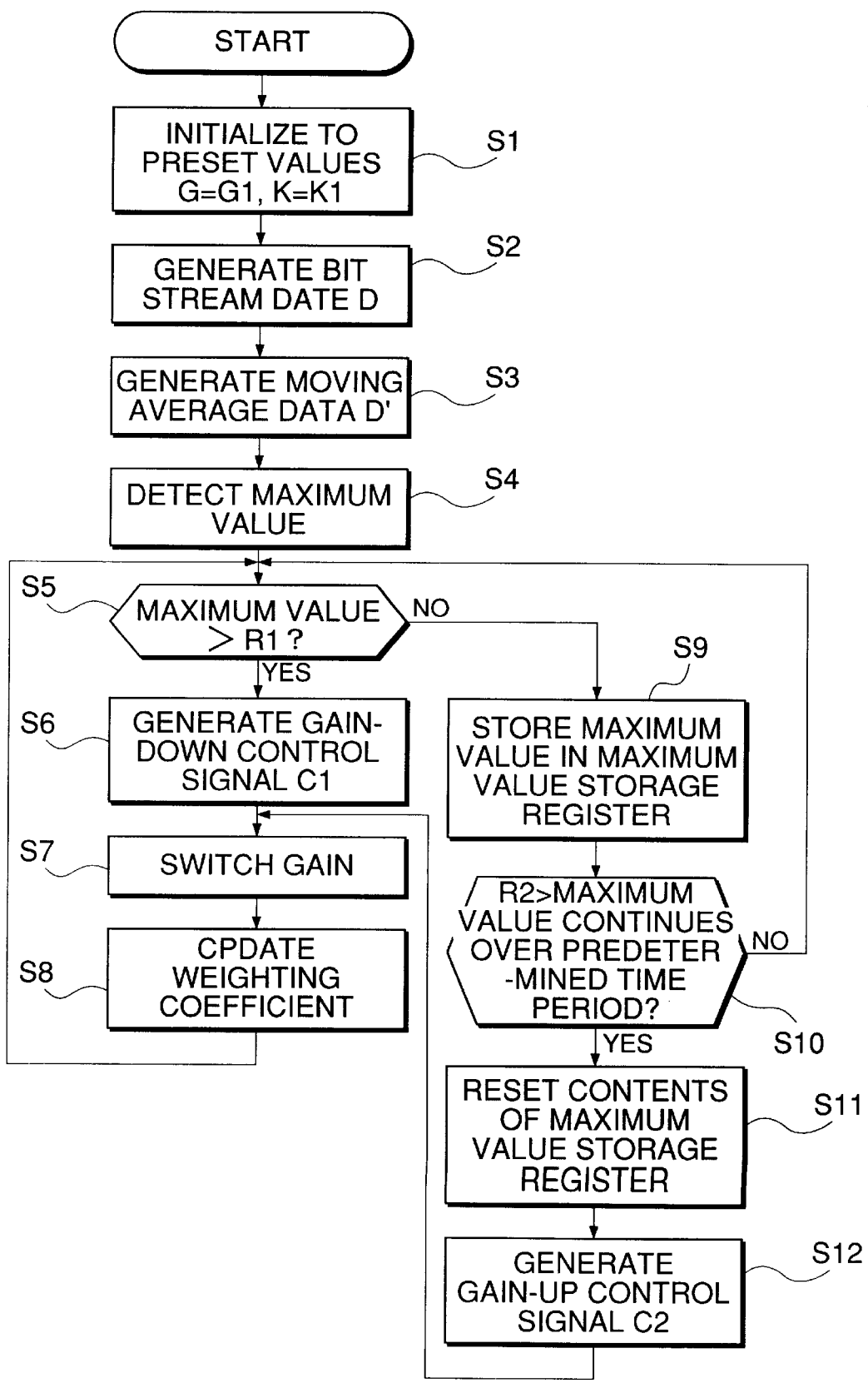
FIG. 11 is a flowchart showing a gain control process carried out by the delta-sigma A/D conversion apparatus.
Figure 12:
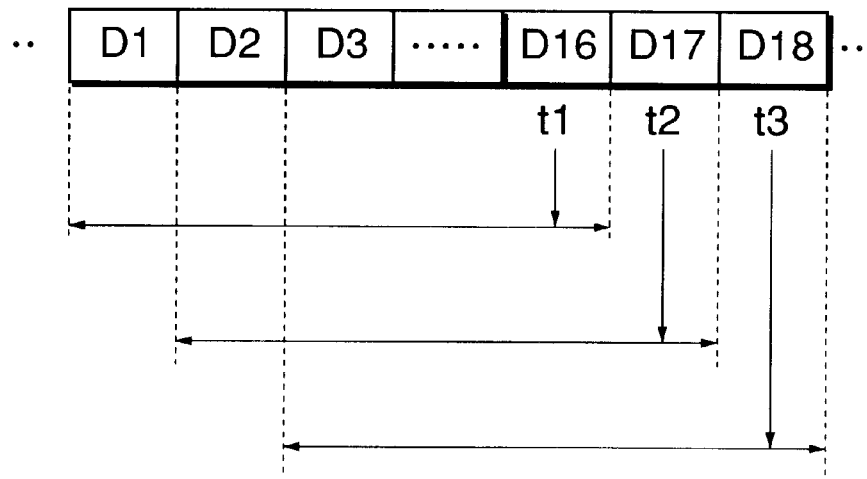
FIG. 12 is a diagram showing the relationship between bit stream data D and moving average data D'.
Figure 13:
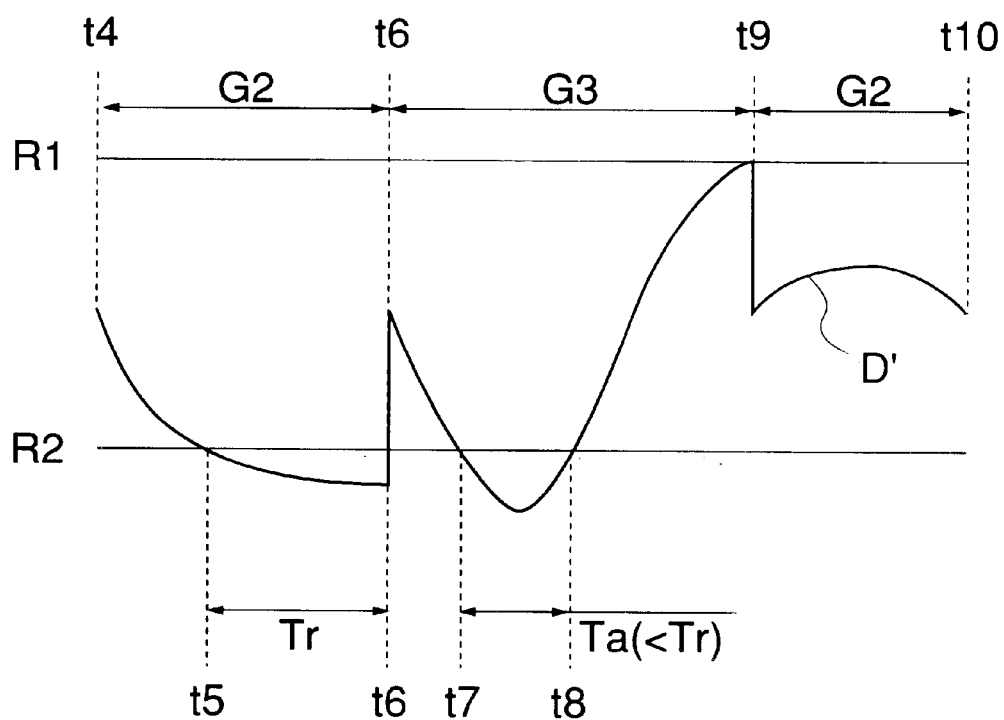
FIG. 13 is a diagram showing the relationship between the maximum value of the moving average data D' and the operation of switching of the gain.

Now, the operation of the delta-sigma A/D conversion apparatus according to the present embodiment will be described with reference to FIGS. 11 to 13. FIG. 11 shows a gain control process carried out by the delta-sigma A/D conversion apparatus.

When power supply voltage is supplied to the delta-sigma A/D conversion apparatus, the gain input G of the gain-controlled $\Delta\Sigma$ modulator 1 and the weighting coefficient K stored in the weighting coefficient are initialized to respective preset values at a step SI. In this embodiment, gain switching of the $\Delta\Sigma$ modulator 1 is carried out between four stages of G1, G2, G3, and G4 (G1<G2<G3<G4). Further, the weighting coefficient K is switched between four values of K1=1/G1, K2=1/G2, K3=1/G3, and K4=1/G4. In the initial state, the input gain is set to G1 and the weighting coefficient K to K1, for instance. The reason for initially selecting the smallest input gain is that in the case where the level of the input analog signal Sin assumes a large value from the outset, if the signal Sin is amplified by a large gain, there is a fear of loss of information due to clipping of the waveform, but by setting the input gain to the smallest value, the A/D conversion can be carried out reliably without the fear of clipping of the waveform of the signal Sin.

Then, the gain-controlled $\Delta\Sigma$ modulator 1 amplifies the input analog signal Sin by the input gain G1, and at the same time conducts oversampling of the amplified signal Sin to produce bit stream data D at a step S2. On this occasion, the second-order noise shaping is carried out to add noise components to the input analog signal Sin in a range higher than its bandwidth. For instance, when the 256-times oversampling is carried out, noise components S(f) exhibit a characteristic having a peak frequency of fs/2 (=6.144 MHz) as shown in FIG. 10.

The moving average-calculating section 210 provided within the gain control circuit 2 then calculates the moving average data D' based on 16 values of the bit stream data D at a step S3. For instance, as shown in FIG. 12, assuming that there are generated bit stream data values of D1, D2, D3, ..., D16, D17, D18, ..., a value of the moving average data D1 is generated based on the values D1 to D16 at a time point t1, and a value of the same is generated based on the values D2 to D17 at the following time point t2. Similarly, at a time point t3, a value of the moving average data D1 is generated based on the values D3 to D18. In short, each average value of 16 values of the bit stream data D is calculated while shifting the range of the 16 values of the bit stream data D by one value.

Next, whenever a value of the moving average data D' is supplied to the maximum value-detecting section 220, the maximum value-detecting section 220 detects the maximum value from values of the moving average data D' obtained over a predetermined time period, at a step S4, and determines whether or not the detected maximum value is larger than the first threshold value R1 at a step S5. If the former is larger than the latter, which means the result of the determination is affirmative (YES), the maximum value-detecting section 220 generates the gain-down control signal C1. However, in the initial state, the input gain is set to the smallest input gain G1, so that the amplification factor of the input analog signal is suppressed to a small value. Therefore, the maximum value of the moving average data D' cannot exceed the first threshold value R1 immediately after the start of the conversion apparatus, and only after the lapse of some time when the input gain has been switched to G2 or a larger value, the gain-down control signal C1 is generated.

When the gain-down control signal C1 is supplied to the ΔΣ modulator 1, switching of the input gain is carried out at a step S7. In this case, since the detected maximum value exceeds the first threshold value R1, the gain is immediately switched in the input gain-decreasing direction, so that the level of the input analog signal Sin can be attenuated immediately. As a result, even if the peak value of the input analog signal Sin sharply rises, no information is lost due to clipping of the waveform of the signal.

Further, when the gain-down control signal C1 is supplied to the weighting register 3, the weighting coefficient K stored therein is updated at a step S8, followed by the program returning to the step S5. For instance, when the weighting coefficient K is currently set to the value K3, if the gain-down signal C1 is supplied to the weighting register 3, the weighting coefficient K is switched from the value K3 to the value K2.

On the other hand, if the result of the determination at the step S5 is negative (NO), that is, if it is determined at the step S5 by the maximum value-detecting section 220 that the detected maximum value is not larger than the first threshold value R1, the program proceeds to a step S9, wherein the detected maximum value is stored in the maximum value storage register 230.

Thereafter, the determination circuit 240 refers to data stored in the maximum value storage register 230 to determine whether or not the detected maximum value has continued to be smaller than the second threshold value R2 over a predetermined time period at a step S10. If the detected maximum value has continued to be smaller than the second threshold value R2 over the predetermined time period, it means that the moving average data D' has continued to assume a small value and hence there is a small possibility of a sharp increase in the value of the data D'. Therefore, to improve the SN ratio, it is appropriate to change the input gain to a larger value. To this end, the determination circuit 240 resets the contents of the maximum value storage holder 230 at a step S11, and at the same time the gain-up control signal C2 is generated at a step S12.

Then, when the ΔΣ modulator 1 detects the gain-up control signal C2, the gain is switched in the input gain-increasing direction at the step S7, and at the same time the weighting coefficient K is updated at a step S8, followed by the program returning to the step S5. On the other hand, if the detected maximum value has continued to be smaller than the second threshold value R2 over the predetermined time period, the result of the determination at the step S10 is negative (NO), and the program returns to the step S5.

The above described process will be explained more in detail with reference to an example shown in FIG. 13. Let it be assumed that the maximum value of the moving average data D' changes as shown in FIG. 13, Tr represents the predetermined time period over which the maximum value should be continuously smaller than the second threshold value R2 to generate the gain-up control signal C2, and further, the input gain G2 is selected at a time point t4. As shown in the figure, if the maximum value of the moving average data D' becomes smaller than the second threshold value R2 at a time point t5, and remains in this state over the predetermined time period Tr up to a time point t6, then, the determination circuit 240 generates the gain-up control signal C2. When the ΔΣ modulator 1 detects the gain-up control signal C2, the input gain is switched in the input gain-increasing direction, whereby the input gain is changed from G2 to G3 at the time point t6, so that the maximum value of the moving average data D' is increased according to this change in the input gain.

Then, the maximum value of the moving average data D' decreases to become smaller than the second threshold value R2 at a time point t7 again, and then increases to become larger than the same at a time point t8. In the illustrated example, a time period Ta from the time point t7 to the time point 8 is shorter than the predetermined time period Tr, so that the gain-up control signal C2 is not generated even at the time point t8 and the input gain G3 is maintained.

Subsequently, when the maximum value of the moving average data D' increases up to a time point t9, at which the maximum value becomes equal to the first threshold value R1, the gain-down control signal C1 is generated to switch the input gain in the input gain-decreasing direction. This causes the input gain G3 to be switched to the input gain G2, so that the maximum value of the moving average data D' is decreased according to this change in the input gain.

In the above described manner, the input gain is switched according to a change in the moving average data D', so that it is possible to expand the dynamic range and carry out the A/D conversion with high accuracy.

As described heretofore, according to the present embodiment, the moving average-calculating section 210 calculates a moving average value of a predetermined number of values of the bit stream data D, and based on the moving average value, the peak value of the input analog signal Sin is determined. This makes it possible to control the input gain of the input analog signal to a one-bit A/D converter employing the oversampling method by means of a simple construction.

Further, the number of values of the bit stream data D used for calculating the moving average value is determined in dependence on the oversampling frequency and the bandwidth of the input analog signal Sin. Therefore, it is possible to sufficiently suppress the shaping noise, and at the same time make the moving average data D' have a flat frequency characteristic of the bandwidth over the input analog signal Sin.

Furthermore, the control of the input gain based on the moving average data D' can be implemented by a logical circuit having a simple configuration. As a result, the delta-signal A/D conversion apparatus can be simplified in construction compared with the conventional A/D conversion system using the CPU and a control program executed thereby. Further the control can be performed with an improved response. As a result, even when the input analog signal Sin sharply rises, the input gain can be attenuated in time before the signal is clipped. Further, a CPU and others using the delta-sigma A/D conversion apparatus according to the embodiment do not need to be conscious of gain control, but are only required to simply process bit stream data D. As a result, a program for waveform processing carried out at a subsequent stage of the A/D conversion can be designed without the gain control taken into consideration.

Also, the gain control according to the present embodiment is configured such that the response in the input gain-decreasing direction is faster than that in the input gain-increasing direction. Therefore, upon a sharp rise in the input analog signal Sin, the input gain can be immediately decreased to prevent the input analog signal from being clipped. On the other hand, since the response in the input gain-increasing direction is slower than that in the input gain-decreasing direction, even if the level of the input analog signal Sin becomes lower than the second threshold R2, the input gain is not switched unless this state continues over a predetermined time period. Therefore, even if the level of the input analog signal Sin momentarily becomes lower that the second threshold value R2, the gain is not switched in the input gain-increasing direction immediately, thereby preventing the signal from being clipped by a subsequent sharp increase in the input analog signal Sin. As a result, no information is lost due to clipping of the signal, and this makes it possible to convert the analog signal to a digital signal without distortion of the waveform.

The weighting register 3 stores the weighting coefficient K dependent on the input gain G, and the input gain G can be reflected in the digital signal by using the weighting coefficient K stored in the weighting register 3.

The invention is by no means limited to the embodiment described above, but it may be practiced in various forms.

(1) Although in the above described embodiment, the bandwidth of the input analog signal Sin is set to an audio signal bandwidth, this is not limitative, but the signal bandwidth may be set to an image signal bandwidth.

(2) Although in the above described embodiment, to obtain the peak value of the input analog signal Sin, the moving average value of the bit stream data D is calculated in order to control the input gain by a simple construction by omitting the processing of conversion of the bit stream data D to multi-bit digital data, this is not limitative, but a filter having a suitable frequency characteristic, a low-pass filter for example, may be employed in place of the moving average-calculating section 210. In short, any means may be employed insofar as it can detect the peak value of the gain-controlled input analog signal Sin, based upon the bit stream data D.

(3) Although in the above embodiment, the gain-controlled ΔΣ modulator 1 shown in FIG. 7 feeds back the number of positive pulses or the number of negative pulses dependent on the control signal CONT in the form of a voltage signal, this is not limitative, but the ΔΣ modulator 1 may feed back the same in the form of a current signal. Further, in place of the number of positive or negative pulses, a signal having a pulse width dependent on the control signal CONT may be formed and fed back in the form of a voltage signal or in the form of a current signal.

(4) Although in the above embodiment, the determination circuit 240 generates the gain-up control signal C2 when the maximum value of the moving average data D' has continued to be smaller than the second threshold value R2 over a predetermined time period, this is not limitative, but the gain-up control signal C2 may be generated when the value of the moving average data D' has continued to be smaller than the second threshold value R2 over a predetermined value. Further, a third threshold value R3 smaller than the second threshold value R2 may be provided, and then the delta-sigma A/D conversion apparatus may be configured such that when the maximum value or value of the moving average data D' becomes smaller than the third threshold value R3, the determination circuit 240 generates the gain-up control signal C2 even before the predetermined time period elapses after the maximum value or value of the moving average data D' has become smaller than the second threshold value R2. This makes it possible to improve the SN ratio in the case of a sharp rise in the input analog signal Sin.

Next, a second embodiment of the invention will be described with reference to FIGS. 14 to 18.

Figure 14:
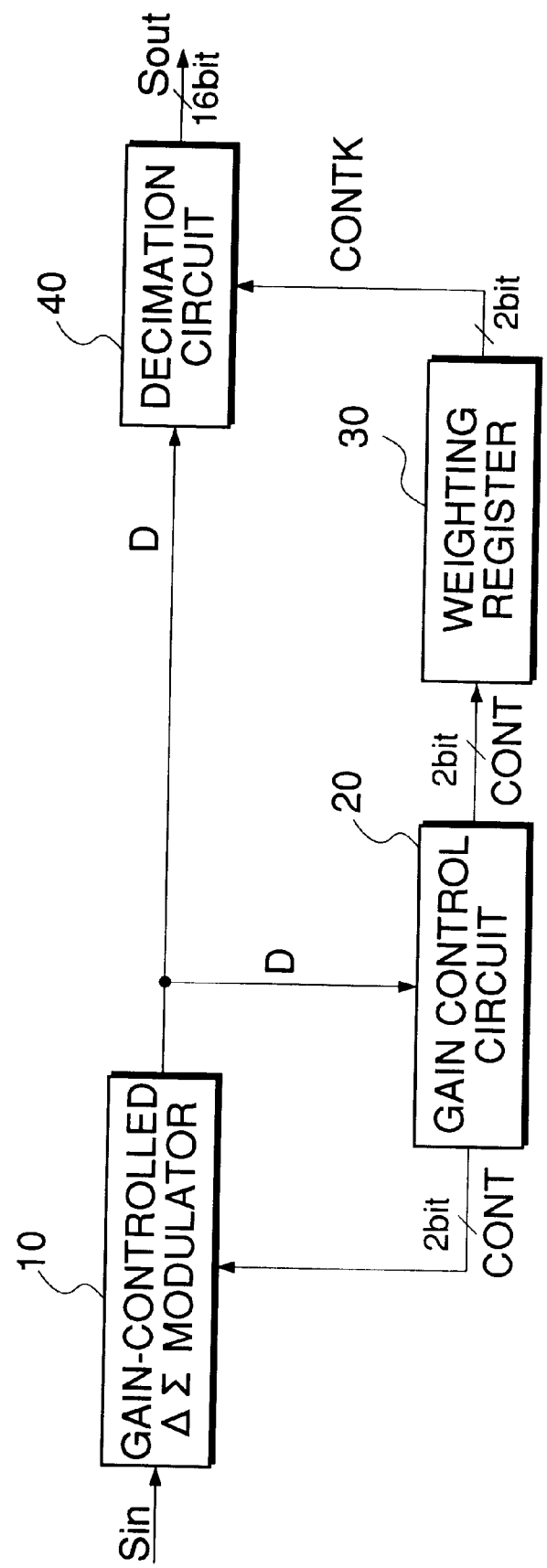
FIG. 14 is a block diagram showing the arrangement of a delta-sigma A/D conversion apparatus according to a second embodiment of the invention.

FIG. 14 shows the arrangement of a delta-sigma A/D conversion apparatus according to the second embodiment. In the figure, reference numeral 10 designates a gain-controlled ΔΣ modulator which is comprised of an input gain control section for controlling the level of an input analog signal Sin based on a control signal CONT supplied from a gain control circuit 20, referred to hereinbelow, an input gain controller which controls or reduces the gain of the ΔΣ modulator such that the gain of the input analog signal Sin becomes equal to 1/A (e.g. 0.5), and a one-bit ΔΣ modulator. The gain-controlled ΔΣ modulator 10 is generally identical in construction with the gain-controlled ΔΣ modulator 1 of the above described first embodiment except those which will be described hereinafter. In the present embodiment, the control signal CONT is composed of two bits, though it is not limited to this.

Reference numeral 20 designates a gain control circuit, which is identical in construction with the gain control circuit 2 of the first embodiment, description of which is omitted.

Reference numeral 30 designates a weighting register, which is different from the weighting register 3 of the first embodiment only in that the former is not supplied with the bit stream data D from the gain-controlled ΔΣ modulator 10. However, the weighting register 30 is similar or identical in function with the weighting register 3, that is, it stores a weighting coefficient K being the reciprocal of the input gain according to the control signal CONT from the gain control circuit 20, and delivers a control signal CONTK corresponding to the stored coefficient K to a decimation circuit 40 at a subsequent stage.

The decimation circuit 40 generates multi-bit digital data to be finally output, based on a window function, hereinafter referred to, the control signal CONTK and the bit stream data D. The construction of the decimation circuit 40 will be described later.

With the above arrangement, when the gain-controlled ΔΣ modulator 10 oversamples the input analog signal Sin to generate the bit stream data D, the gain control circuit 20 detects a peak value of the gain-controlled input analog signal Sin, based on the bit stream data D, and generates the control signal CONT based on the detected peak value. The gain-controlled ΔΣ modulator 10 controls the input gain of the input analog signal at a front end of the delta-sigma conversion apparatus in response to the control signal CONT such that the level of the signal subjected to the A/D conversion is held within a predetermined range. Further, the ΔΣ modulator 10 reduces the gain by controlling feedback voltage in response to a maximum value of the input analog signal Sin such that the input gain of the input analog signal Sin becomes equal to 1/A (e.g. 0.5), to thereby reduce noise of the output digital signal.

Figure 15:
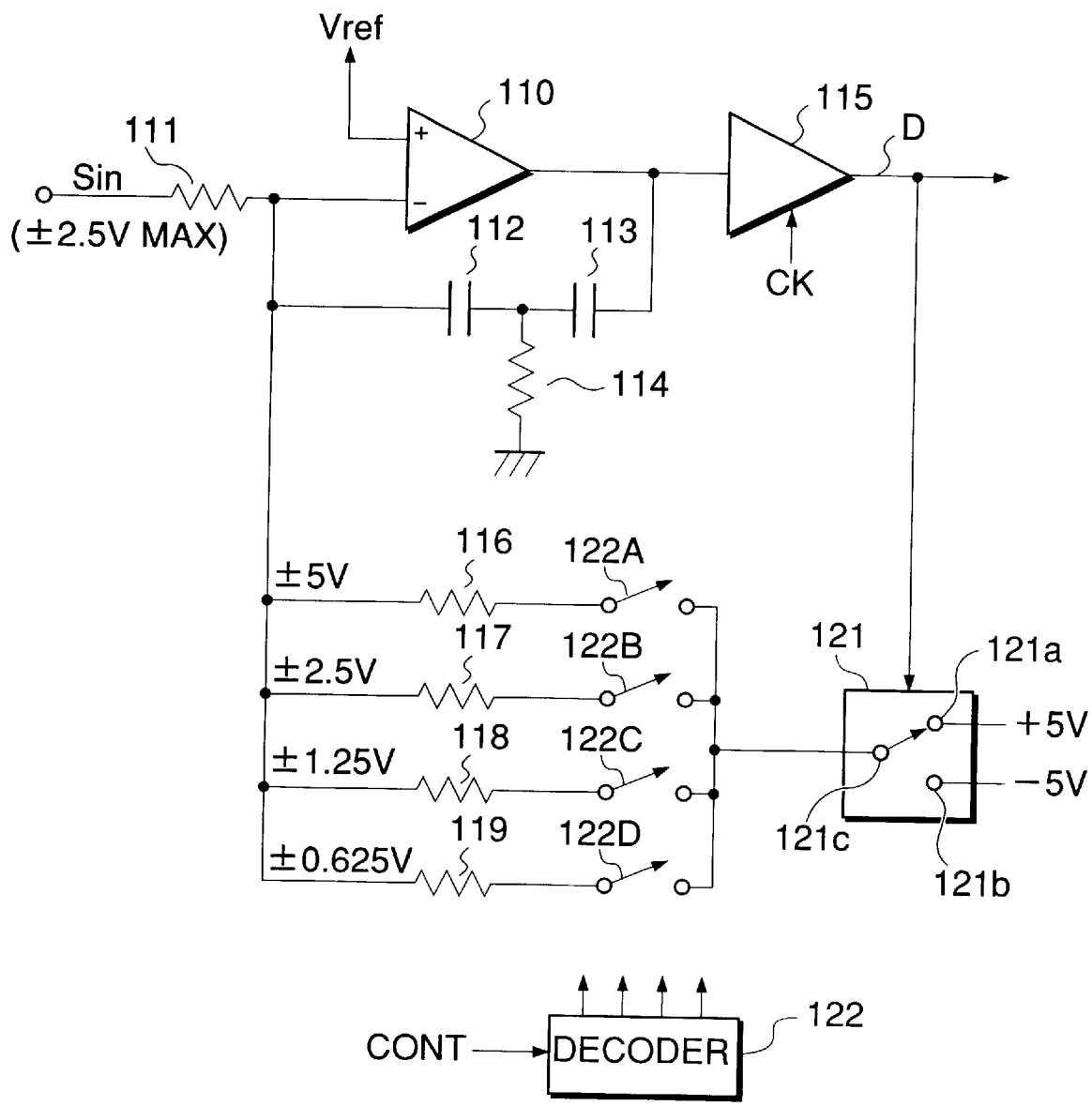
FIG. 15 is a circuit diagram showing the construction of a gain-controlled ΔΣ modulator 10 appearing in FIG. 14.

FIG. 15 shows the construction of the gain-controlled ΔΣ modulator 10. In the figure, component elements corresponding to those in FIG. 5 are designated by identical reference numerals, description of which is omitted.

A switch 121 has a terminal 121a thereof supplied with a positive reference voltage (e.g. +5 V), and a terminal 121b thereof supplied with a negative reference voltage (e.g. −5 V). The switching operation of the switch 121 is controlled based on the bit stream data D supplied to a control terminal of the switch 121.

A decoder 122 and switches 122A to 122D collectively constitute a selector, which has a function of selectively opening and closing a plurality of feedback voltage-setting resistances 116 to 119 in response to the maximum value of the input analog signal Sin such that the gain becomes equal to 1/A. For example, if the input analog signal Sin input to a negative input terminal of an operational amplifier 110 assumes ±2.5 V, the decoder 122 generates a switching signal based on the control signal CONT from the gain control circuit 20 to close the switch 122A and thereby select the resistance 116, whereby the feedback voltage becomes ±5 V which is twice the maximum value (±2.5 V) of the input analog signal Sin to thereby reduce the gain.

Thus, the decoder 122 selectively closes the switches 122A to 122D based on the control signal CONT from the gain control circuit 20 such that the feedback voltage becomes twice the maximum value of the input analog signal Sin. In the present embodiment, the gain-controlled ΔΣ modulator 10 can select a plurality of feedback voltages (±5 V, ±2.5 V, ±1.25 V, ±0.675 V) so as to always reduce the gain to 0.5.

The gain-controlled ΔΣ modulator 10 generates the bit stream data D of 1 bit and the control signal CONT of 2 bits, and therefore forms a multi-bit output ΔΣ modulator.

Figure 16:
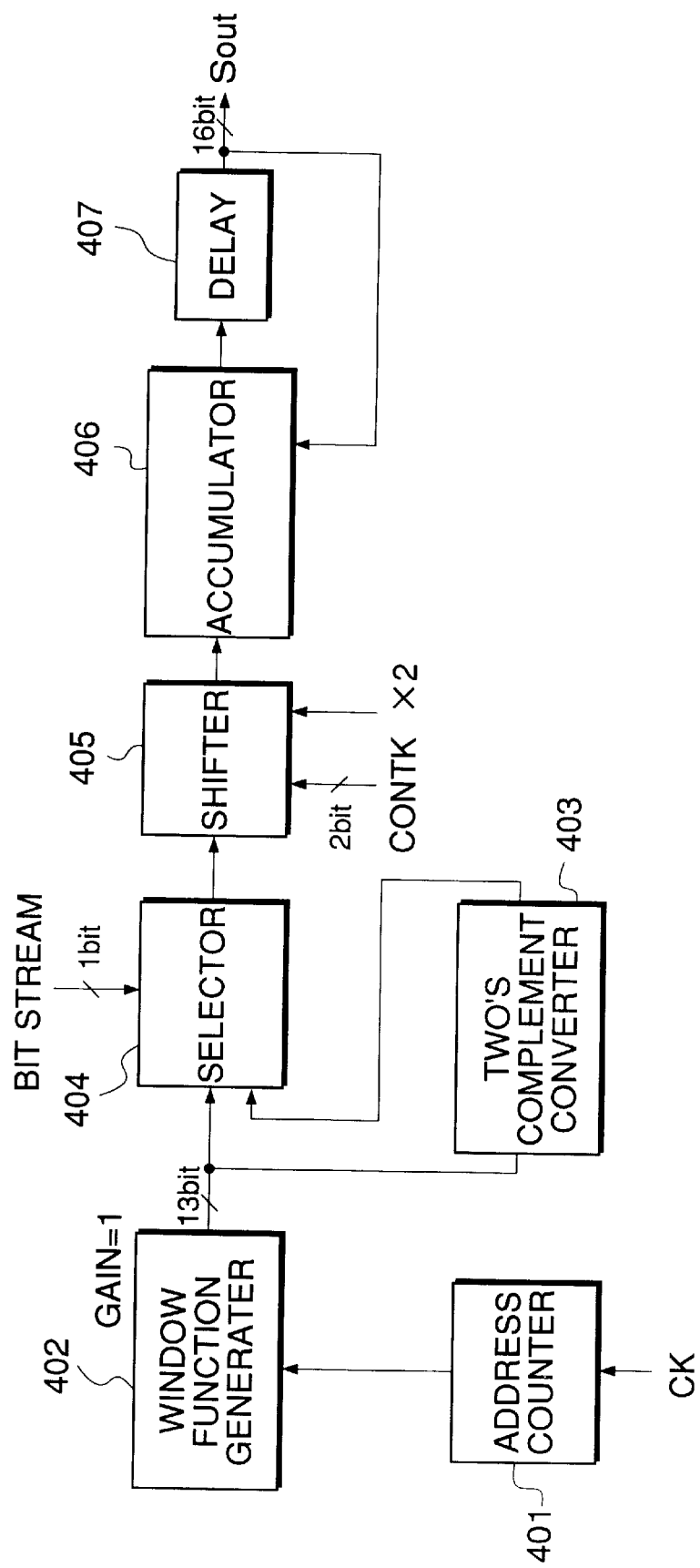
FIG. 16 is a block diagram showing the arrangement of a first example of a decimation circuit 40 appearing in FIG. 14.
Figure 18:
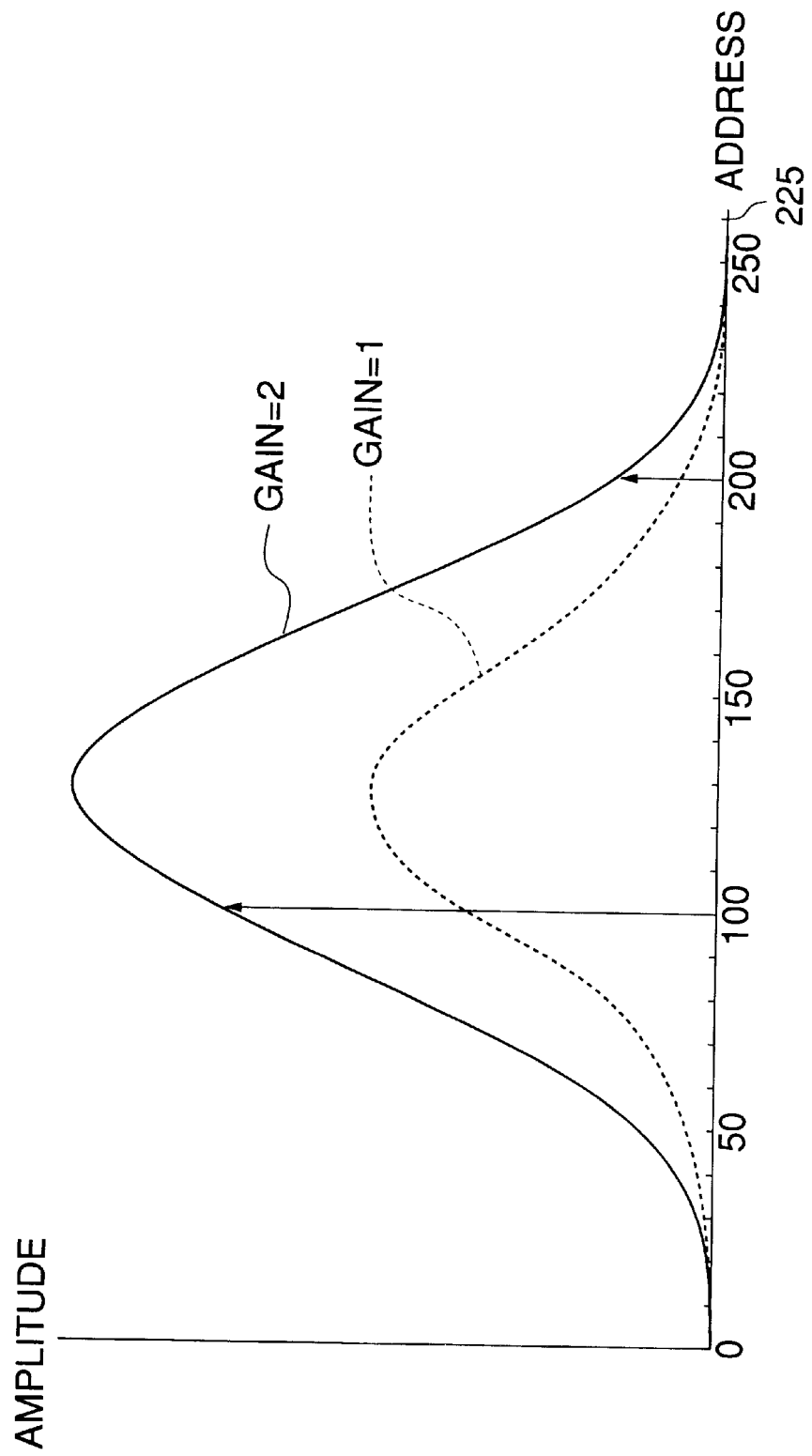
FIG. 18 is a graph showing the relationship between the amplitude of a window function and addresses.

FIG. 16 shows an example of the construction of the decimation circuit 40. In the figure, reference numeral 401 designates an address counter which operates on a clock CK having an oversampling frequency obtained by multiplying the sampling frequency Fs by 256, to sequentially generate addresses of 0 to 255. Reference numeral 402 designates a window function generator which generates a 13-bit window function according to addresses generated by the address counter 401. The purpose of the window function generator 402 is to remove quantization noise caused by a multi-bit output from the gain-controlled ΔΣ modulator 10. The window function generated by the window function generator 40 consists of 256 samples, as shown in FIG. 18, each sample consisting of 13 bits and not including a sign bit. Reading of each sample of the window function is carried out at a rate of the oversampling frequency 256Fs. Consequently, one period of 256 samples is read out at a rate of the sampling frequency Fs.

In FIG. 16, reference numeral 403 designates a two's complement converter which converts an output of the window function generator 402 to a two's complement by inverting each bit value of the output signal of the window function generator 402 and adding "1" to the inverted value. Reference numeral 404 designates a selector which selects the output signal of the window function generator when the bit stream data D from the gain-controlled ΔΣ modulator 10 is "1", and selects an output signal of the two's complement converter 403 when the bit stream data D is "0". The selector 404 generates an output signal which is the sum of the 13-bit output signal of the window function generator 402 or the two's complement converter 403 and the bit stream data D which is 1 bit applied to the selector 404 as a sign bit, that is, the output signal of the selector 404 is a 14-bit signal. Reference numeral 405 designates a shifter which multiplies the 14-bit output signal from the selector 404 and the 2-bit control signal CONTK from the weighting register 30, and multiplies the resulting product or 16-bit signal by a value of 2 as a gain. By thus multiplying the 16-bit signal by the gain of 2, the gain of the gain-controlled ΔΣ modulator 10 which is reduced to 0.5 as mentioned before can be returned to 1, and hence a full-scale output signal can be obtained.

An output signal of the shifter 405 is delivered to an accumulator 406 which in turn cooperates with a delay circuit 407 at a subsequent stage to carry out a convolution operation by accumulating the output signal of the shifter 405, and the convolution result is output as a 16-bit digital signal.

Figure 17:
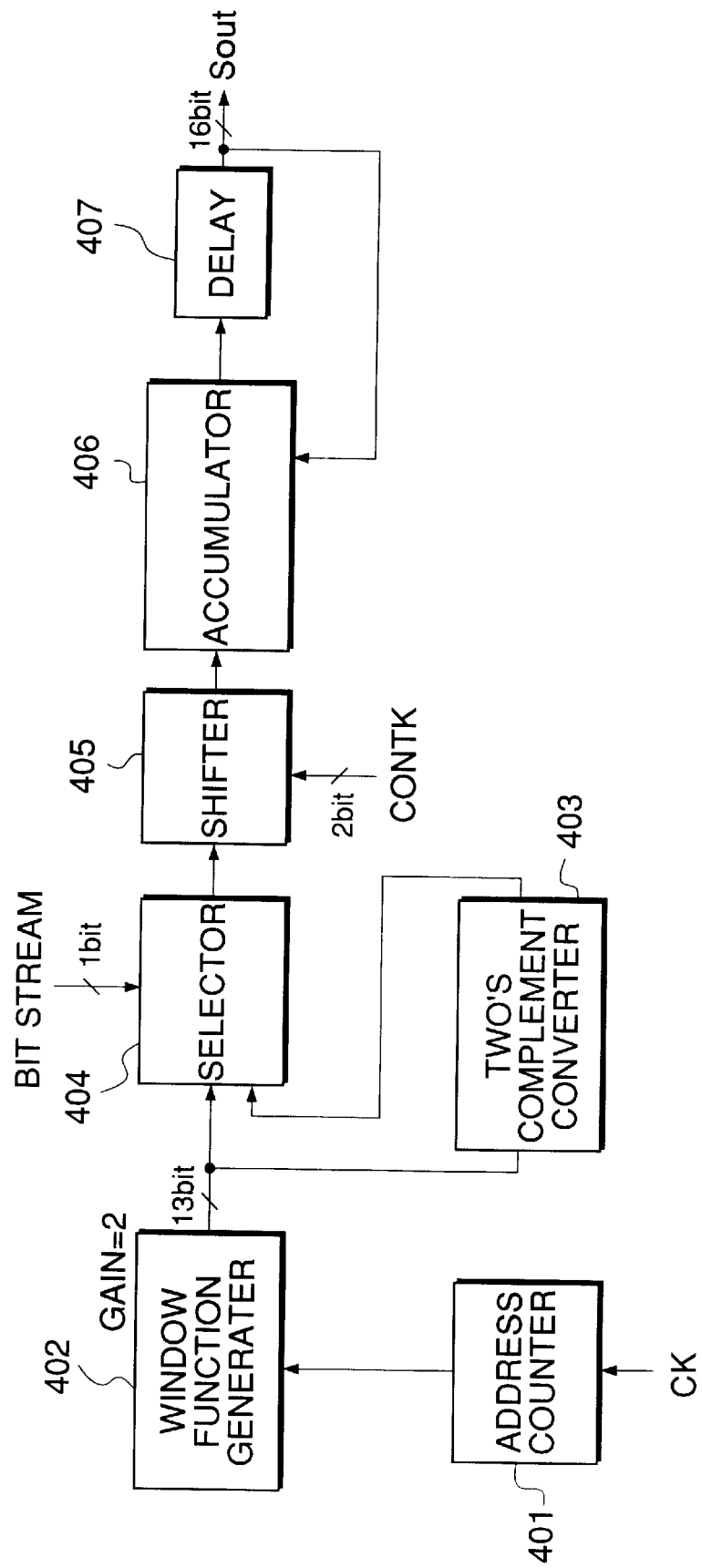
FIG. 17 is a block diagram showing the arrangement of a second example of the decimation circuit 40 appearing in FIG. 14.

FIG. 17 shows another example of the construction of the decimation circuit 40. The construction of the decimation circuit 40 according to this example is distinguished from that of FIG. 16 in that in the FIG. 17 example the window function generator 402 has a gain of 2 and the shifter 405 has no gain compensating function. An example of the window function generated by the window function generator 402 of FIG. 17 is shown by the solid line in FIG. 18.

According to the present embodiment, the gain-controlled ΔΣ modulator 10 selects a plurality of feedback voltage values according to the maximum value of the input analog signal Sin such that its gain becomes equal to 1/A (e.g. 0.5), and on the other hand, gain compensation (gain of 2) for returning the reduced gain to 1 is carried out by the shifter 405 of the decimation circuit 40 or by setting the window function of the window function generator 402 so as to obtain a full-scale output signal, whereby noise of the output digital signal can be effectively reduced while securing a wide dynamic range of A/D conversion.

The weighting register 30 may be omitted by designing the shifter 405 to perform the function of the weighting register 30 as well.

Next, a third embodiment of the invention will be described with reference to FIGS. 19 to 22.

The third embodiment is distinguished from the above described second embodiment in that the gain compensation is carried out not by the decimation circuit 40 but by a high-pass filter at a subsequent stage thereof.

Figure 19:
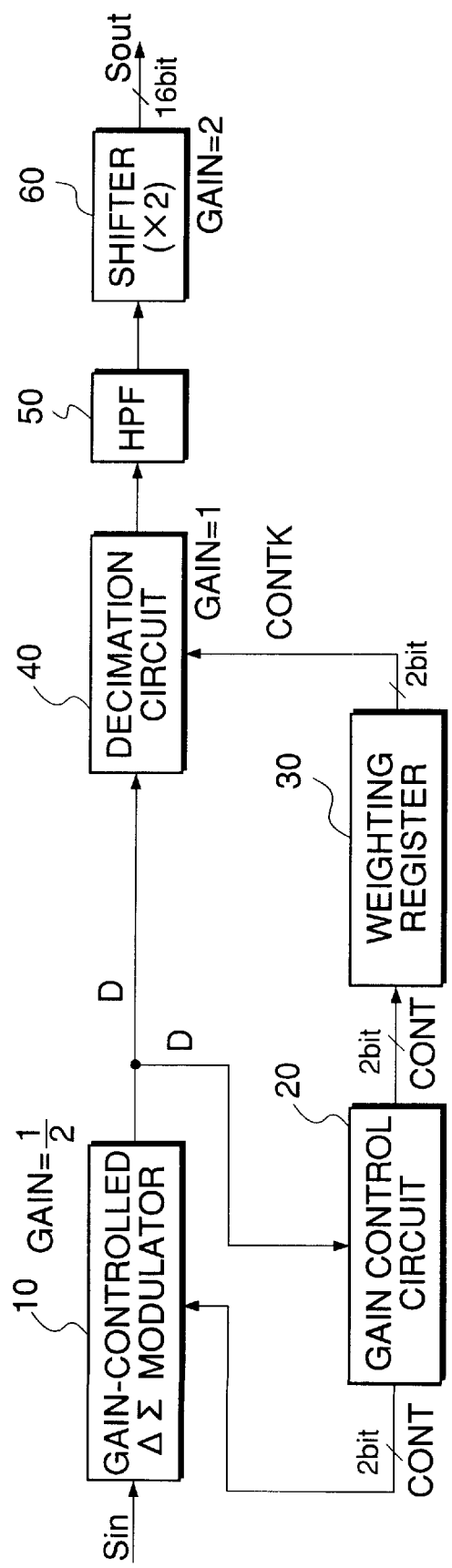
FIG. 19 is a block diagram showing the arrangement of a delta-sigma A/D conversion apparatus according to a third embodiment of the invention.

The arrangement of the delta-sigma A/D conversion apparatus according to the third embodiment is shown in FIG. 19. In the figure, component elements corresponding to those in FIG. 14 and FIG. 16 or FIG. 17 are designated by identical reference numerals, description of which is omitted.

Figure 20:
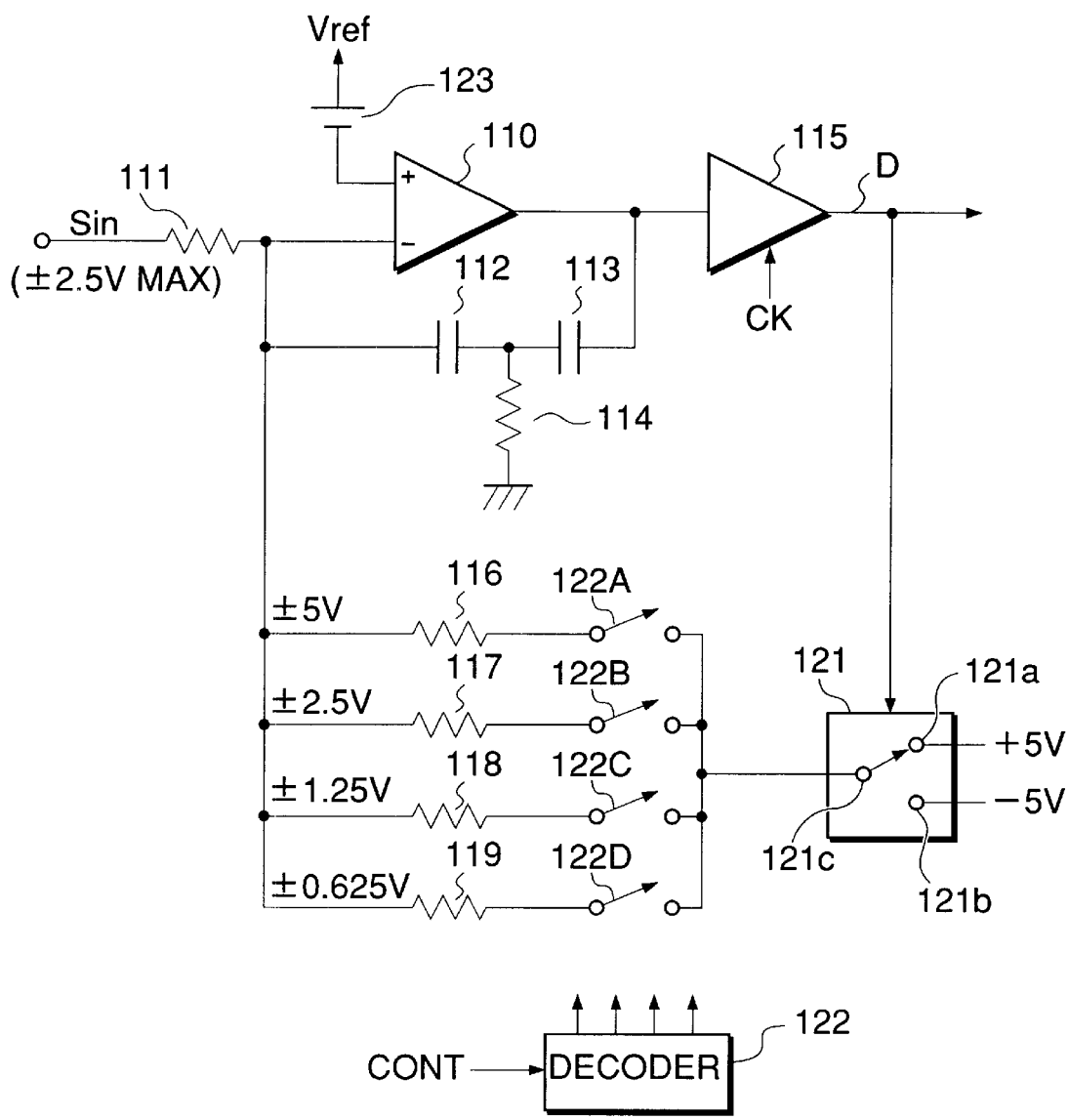
FIG. 20 is a circuit diagram showing the construction of a gain-controlled ΔΣ modulator 10 appearing in FIG. 19.

In FIG. 19, reference numeral 10 designates a gain-controlled ΔΣ modulator, the construction of which is shown in FIG. 20.

The gain-controlled ΔΣ modulator 10 of the present embodiment is identical in basic construction with the gain-controlled ΔΣ modulator 10 of the above described second embodiment, but distinguished from the latter only in that in the present embodiment a predetermined dither voltage 123 (e.g. +60 my) is added to reference voltage Vref applied to a positive input terminal of an operational amplifier 110 of the gain-controlled ΔΣ modulator 10. The addition of the predetermined dither voltage 123 is intended to shift a digital value of a DC offset component (approximately ±10 mV) contained in the input analog signal Sin to a bandwidth exceeding the audible bandwidth to thereby prevent the DC offset component from being reflected in the audible bandwidth, that is, from being heard by a listener. In FIG. 20, component elements corresponding to those in FIG. 15 are designated by identical reference numerals, description of which is omitted.

Figure 21:
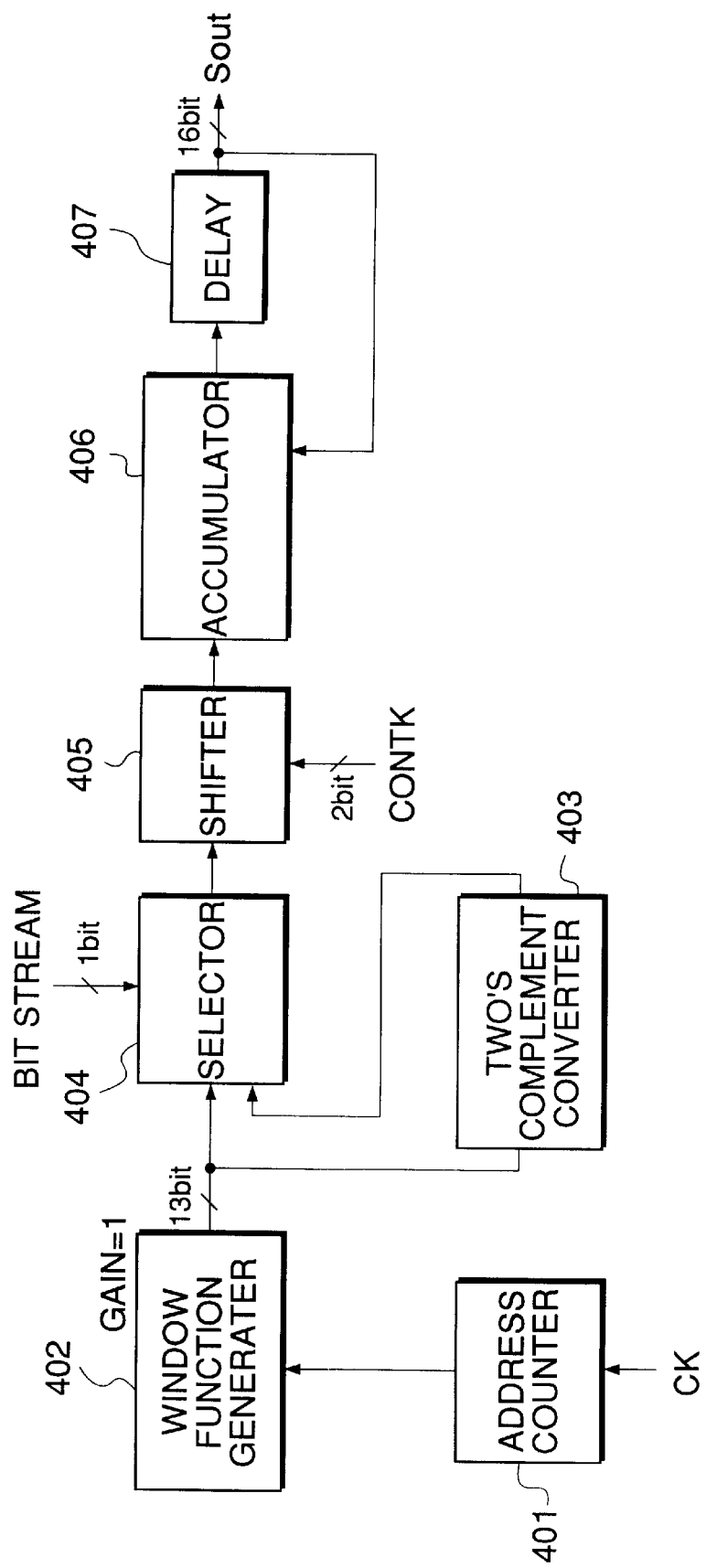
FIG. 21 is a block diagram showing the arrangement of a decimation circuit 40 appearing in FIG. 19.

Referring again to FIG. 19, reference numeral 40 designates a decimation circuit, the construction of which is shown in FIG. 21. The decimation circuit 40 of the present embodiment is distinguished from the decimation circuit of FIG. 14 only in that the former has a gain of 1, and substantially identical in construction and function with the decimation circuit 40 shown in FIG. 16 or FIG. 17. That is, in the decimation circuit 40 of the present embodiment, the shifter 405 is not supplied with a gain of 2, and the window function generated by the window function generator 402 has a gain of 1 (as indicated by the broken line in FIG. 18), i.e. no gain compensation is carried out.

Referring again to FIG. 19, provided at a subsequent stage of the decimation circuit 40 are a high-pass filter 50 which removes a DC offset component, and a shifter 60 which carries out gain compensation (gain=2) so as to obtain a full-scale output signal.

With the above arrangement of the delta-sigma A/D conversion apparatus according to the present embodiment, the gain-controlled $\Delta\Sigma$ modulator 10 reduces the gain, and the shifter 60 subsequent to the high-pass filter 50 performs the gain compensation. Therefore, similarly to the above described second embodiment, noise of the output digital signal can be effectively reduced while securing a wide dynamic range of A/D conversion. Also in the present embodiment, the weighting register 30 may be omitted by designing the shifter 405 to perform the function of the weighting register 30 as well.

Particularly, according to the present embodiment, no gain is applied to the decimation circuit 40 and the high-pass filter 50, which provides a unique effect of avoiding clipping of the input analog signal even when the analog input signal contains a DC offset component, which occurred in the prior art as described before. This will be explained in detail with reference to FIGS. 22A to 22C.

Figure 22A:
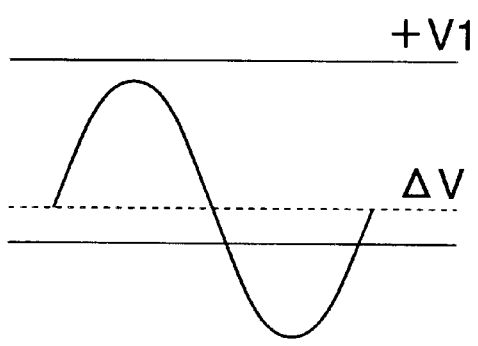
Figure 22B:
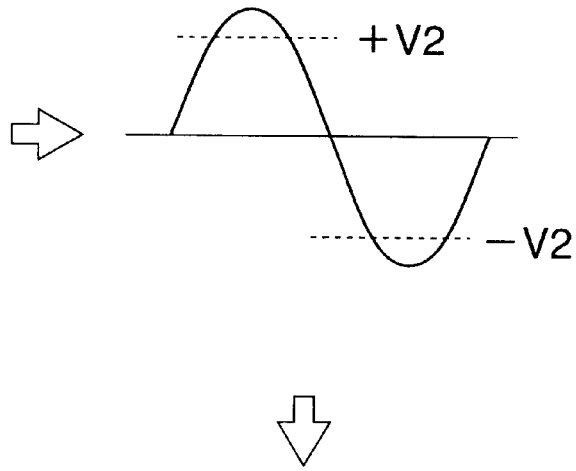
Figure 22C:
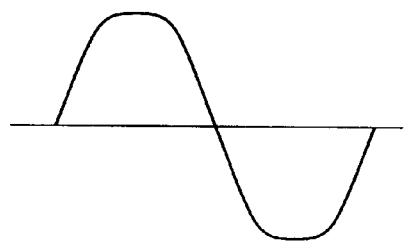

In the present embodiment, since no gain is applied to the decimation circuit 40 and the high-pass filter 50, clip levels ±V1 of the gain-controlled $\Delta\Sigma$ modulator 10 themselves directly act as clip levels of the decimation circuit 40 as shown in FIG. 22A. Therefore, even in the case of a large amplitude analog input signal Sin having a DC offset $\Delta V$ as shown in FIG. 22A, there is no possibility that a clipped state occurs in the decimation circuit 40. Further, even if the DC offset is removed by the high-pass filter 50, no clipped state occurs in the output of the high-pass filter 50 as shown in FIG. 22B. Further, the shifter 60 applies the gain of 2 to the output of the high-pass filter 50 so that a clipped state can occur in the final output signal as shown in FIG. 22C. However, only small parts in the waveform of the output of the high-pass filter 50 can be slightly clipped at clip levels ±V2 because the DC offset has been already removed. Moreover, the clip levels are formed symmetrically with respect to the positive and negative sides of the waveform, so that there is no possibility of a single large level of clip being generated only on the positive side or negative side of the waveform. Thus, in contrast to the prior art in which clipping occurs under a state where a DC offset exists, the degree of distortion in the waveform due to the clipping can be remarkably reduced.

What is claimed is:

1. An A/D conversion apparatus comprising:
   an input gain control device that controls gain of an input signal based on a control signal;
   a $\Delta\Sigma$ modulator that carries out oversampling of said input signal having the gain thereof controlled by said input gain control device to convert said input signal to data of one bit;
   a detecting device that detects a peak value of said input signal based on said data of one bit; and
   a gain control device that generates said control signal based on said peak value detected by said detecting device in a manner such that said input signal having the gain thereof controlled falls within a predetermined range.

2. An A/D conversion apparatus comprising:
   an input gain control device that controls gain of an input signal based on a control signal;
   a $\Delta\Sigma$ modulator that carries out oversampling of said input signal having the gain thereof controlled by said input gain control device to convert said input signal to data of one bit;
   a moving average-calculating device that calculates moving average data indicative of a moving average of said data of one bit; and
   a gain control device that generates said control signal based on said moving average data in a manner such that said input signal having the gain thereof controlled falls within a predetermined range.

3. An A/D conversion apparatus according to claim 2, wherein said moving average-calculating device calculates said moving average data based on a plurality of values of said data of one bit in a manner such that shaping noise generated by said oversampling of said input signal by said a $\Delta\Sigma$ modulator can be sufficiently suppressed, and at the same time said moving average data has a flat frequency characteristic over a bandwidth of said input signal.

4. An A/D conversion apparatus according to claim 3, wherein a number of the values of said data of one bit used for calculating the moving average data is set based on at least one of a frequency of said oversampling and the bandwidth of said input signal.

5. An A/D conversion apparatus according to claim 1, wherein said gain control device generates said control signal with a faster response in a gain-decreasing direction and with a slower response in a gain-increasing direction.

6. An A/D conversion apparatus according to claim 2, wherein said gain control device generates said control signal with a faster response in a gain-decreasing direction and with a slower response in a gain-increasing direction.

7. An A/D conversion apparatus according to claim 6, including a maximum value-detecting device that detects a maximum value of said moving average data over a predetermined time period, and wherein said gain control device generates said control signal in said gain-decreasing direction when said maximum value becomes larger than a first predetermined value.

8. An A/D conversion apparatus according to claim 7, wherein said first predetermine value is set to a value smaller than a saturation level of said input signal in dependence on a slew rate of said input signal and a response of said gain control device.

9. An A/D conversion apparatus according to claim 7, wherein said gain control device generates said control signal in said gain-increasing direction when the maximum value of said moving average data continues to be smaller than a second predetermined value smaller than said first predetermine over a predetermined time period.

10. An A/D conversion apparatus according to claim 9, wherein said gain control device generates said control signal in said gain-increasing direction when the maximum value of said moving average data becomes smaller than a third predetermined value smaller than said second predetermined value.

11. An A/D conversion apparatus according to claim 9, wherein said gain control device generates said control signal in said gain-increasing direction when a value of said moving average data becomes smaller than a third predetermined value smaller than said second predetermined value.

12. An A/D conversion apparatus according to claim 7, wherein said control device generates said control signal in said gain-increasing direction when a value of said moving average data continues to be smaller than a second value smaller than said first predetermine value.

13. An A/D conversion apparatus according to claim 1, including a storage device that stores a weighting coefficient for weighting said data of one bit, said weighting coefficient being generated based on said control signal.

14. An A/D conversion apparatus according to claim 13, wherein said weighting coefficient is set in a manner such that as said gain is increased, said weighting coefficient is decreased, and as said gain is decreased, said weighting coefficient is increased.

15. An A/D conversion system according to claim 14, wherein said weighting coefficient is set to a reciprocal of said gain.

16. An A/D conversion apparatus comprising:

an input gain control device that controls gain of an input signal based on a control signal;

a ΔΣ modulator that carries out oversampling of said input signal having the gain thereof controlled by said input gain control device to convert said input signal to data of one bit;

a moving average-calculating device that calculates moving average data indicative of a moving average of said data of one bit;

a detecting device that detects a peak value of said input signal based on said moving average; and a gain control device that generates said control signal based on said peak value detected by said detecting device in a manner such that said input signal having the gain thereof controlled falls within a predetermined range.

17. An A/D conversion apparatus comprising:

a ΔΣ modulator having a gain control function that controls gain of an input signal based on a first gain factor corresponding to a control signal, and carries out oversampling of said input signal having the gain thereof controlled to convert said input signal to bit stream data;

a gain control device that generates said control signal representative of a peak value of said input signal based on said bit stream data from said ΔΣ modulator; and a decimation circuit that generates a multiple-bit digital signal based upon said bit stream data from said ΔΣ modulator and said control signal from said gain control device in a manner such that a second gain factor is applied to said multiple-bit digital signal to compensate for the gain of said input signal controlled based upon said first gain factor by said ΔΣ modulator.

18. An A/D conversion apparatus comprising:

a ΔΣ modulator having a gain control function that controls gain of an input signal based on a first gain factor corresponding to a control signal, and carries out oversampling of said input signal having the gain thereof controlled to convert said input signal to bit stream data;

a gain control device that generates said control signal representative of a peak value of said input signal based on said bit stream data from said ΔΣ modulator;

a decimation circuit that generates a multiple-bit digital signal based upon said bit stream data from said ΔΣ modulator and said control signal from said gain control device in a manner such that a second gain factor is applied to said multiple-bit digital signal to compensate for the gain of said input signal controlled based upon said first gain factor by said ΔΣ modulator, wherein said ΔΣ modulator further includes a third gain factor that is set to a fixed value (A), said ΔΣ modulator controlling the gain of said input signal based upon said third gain factor (A) and said first gain factor, and carrying out oversampling of said input signal having the gain thereof controlled to convert said input signal to said bit stream data.

19. An A/D conversion apparatus according to claim 18, wherein said decimation circuit further has a fourth gain factor set to a fixed value (1/A), said decimation circuit compensating for the gain of said input signal based upon said fourth gain factor (1/A) and said second gain factor.

20. An A/D conversion apparatus comprising:

a ΔΣ modulator having a gain control function that controls gain of an input signal based on a first gain factor corresponding to a control signal and a second gain factor set to a fixed value (A), and carries out oversampling of said input signal having the gain thereof controlled to convert said input signal to bit stream data;

a gain control device that generates said control signal representative of a peak value of said input signal based on said bit stream data from said ΔΣ modulator;

a decimation circuit that generates a multiple-bit digital signal based upon said bit stream data from said ΔΣ modulator and said control signal from said gain control device in such a manner that a third gain factor is applied to said multiple-bit digital signal to compensate for the gain of said input signal controlled based upon said first gain factor by said ΔΣ modulator;

a high-pass filter that removes a direct current component in said multiple-bit digital signal generated from said decimation circuit; and a gain applying circuit that applies a fourth gain factor set to a fixed value (1/A) to said multiple-bit digital signal having the direct current component removed from high-pass filter, to compensate for the gain of said input signal controlled based upon said second gain factor (A) by said ΔΣ modulator.

* * * * *